(12) United States Patent
Chuang et al.

(10) Patent No.: US 10,943,049 B2
(45) Date of Patent: Mar. 9, 2021

(54) RULE CHECK VIOLATION PREDICTION SYSTEMS AND METHODS

(71) Applicant: Taiwan Semiconductor Manufacturing Co., Ltd., Hsinchu (TW)

(72) Inventors: Yi-Lin Chuang, Taipei (TW); Henry Lin, Hsinchu (TW); Szu-Ju Huang, Hsin-pu Town (TW); Yin-An Chen, Hsinchu (TW); Amos Hong, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/400,664

(22) Filed: May 1, 2019

(65) Prior Publication Data

US 2020/0104457 A1    Apr. 2, 2020

Related U.S. Application Data

(60) Provisional application No. 62/738,159, filed on Sep. 28, 2018.

(51) Int. Cl.
*G06F 30/398* (2020.01)
*G06N 20/00* (2019.01)
(Continued)

(52) U.S. Cl.
CPC .......... *G06F 30/398* (2020.01); *G06F 30/327* (2020.01); *G06F 30/392* (2020.01); *G06F 30/394* (2020.01); *G06N 20/00* (2019.01)

(58) Field of Classification Search
CPC .... G06F 30/398; G06F 30/392; G06F 30/394; G06F 30/39; G06F 2119/18;
(Continued)

(56) References Cited

U.S. PATENT DOCUMENTS 5,526,517 A * 6/1996 Jones ................. G06F 30/00
707/999.008
7,278,127 B2 * 10/2007 Darden ................ G06F 30/398
716/112

(Continued)

OTHER PUBLICATIONS

Fakheri et al.; "Detailed routing violation prediction during placement using machine learning"; 2017 International Symposium on VLSI Design, Automation and Test (VLSI-DAT); Conference Paper | Publisher: IEEE (Year: 2017).*

(Continued)

*Primary Examiner* — Helen Rossoshek
(74) *Attorney, Agent, or Firm* — Seed Intellectual Property Law Group LLP

(57) ABSTRACT

Systems and methods are provided for predicting systematic design rule check (DRC) violations in a placement layout before routing is performed on the placement layout. A systematic DRC violation prediction system includes DRC violation prediction circuitry. The DRC violation prediction circuitry receives placement data associated with a placement layout. The DRC violation prediction circuitry inspects the placement data associated with the placement layout, and the placement data may include data associated with a plurality of regions of the placement layout, which may be inspected on a region-by-region basis. The DRC violation prediction circuitry predicts whether one or more systematic DRC violations would be present in the placement layout due to a subsequent routing of the placement layout.

17 Claims, 16 Drawing Sheets

(51) Int. Cl.
*G06F 30/392* (2020.01)
*G06F 30/394* (2020.01)
*G06F 30/327* (2020.01)

(58) Field of Classification Search
CPC .... G06F 30/367; G06F 11/3604; G06F 30/20; G06F 30/327; G06N 20/00
See application file for complete search history.

(56) References Cited

U.S. PATENT DOCUMENTS

| | | | | |
|---|---|---|---|---|
| 7,322,018 B2* | 1/2008 | Rast | ............... | G06F 30/398 716/52 |
| 7,353,476 B2* | 4/2008 | Imada | ............... | G06F 30/39 716/112 |
| 7,661,078 B1* | 2/2010 | Noice | ............... | G06F 30/39 716/136 |
| 7,861,203 B2* | 12/2010 | White | ............... | G06F 30/392 716/129 |
| 7,926,005 B1* | 4/2011 | Li | ............... | G06F 30/394 716/51 |
| 8,001,516 B2* | 8/2011 | Smith | ............... | G06F 30/39 716/136 |
| 8,037,441 B2* | 10/2011 | Ringe | ............... | G06F 30/394 716/119 |
| 8,181,125 B2* | 5/2012 | Culler | ............... | G06F 30/39 716/52 |
| 8,302,061 B2* | 10/2012 | Fujimura | ............... | G03F 7/70125 716/126 |
| 8,423,940 B2* | 4/2013 | Daellenbach | ............... | G06F 30/394 716/115 |
| 8,510,689 B1* | 8/2013 | White | ............... | G06F 30/39 716/104 |
| 8,713,484 B2* | 4/2014 | Scheffer | ............... | G03F 7/70425 716/51 |
| 8,716,869 B2* | 5/2014 | Nakagawa | ............... | H01L 27/0207 257/773 |
| 8,719,746 B1* | 5/2014 | Davidovic | ............... | G06F 30/398 716/112 |
| 8,806,414 B2* | 8/2014 | Huang | ............... | G06F 30/398 716/136 |
| 8,839,177 B1* | 9/2014 | Aubel | ............... | G06F 30/392 716/132 |
| 9,690,898 B2* | 6/2017 | Graur | ............... | G06F 30/39 |
| 9,792,397 B1* | 10/2017 | Nagaraja | ............... | G06F 30/327 |
| 10,089,433 B2* | 10/2018 | Hsu | ............... | G06F 30/392 |
| 10,331,842 B2* | 6/2019 | Alloatti | ............... | G06F 30/398 |
| 10,628,546 B1* | 4/2020 | Colwell | ............... | G06N 20/20 |
| 10,706,201 B1* | 7/2020 | Ding | ............... | G06F 30/394 |
| 10,810,346 B2* | 10/2020 | Chuang | ............... | G06N 20/00 |
| 2005/0071797 A1* | 3/2005 | Fujii | ............... | G06F 30/398 716/112 |
| 2006/0156267 A1* | 7/2006 | Kato | ............... | G06F 30/394 716/112 |
| 2007/0079266 A1* | 4/2007 | Devineni | ............... | G06F 30/398 716/112 |
| 2016/0171149 A1* | 6/2016 | Alloatti | ............... | G06F 30/392 716/52 |
| 2018/0121594 A1* | 5/2018 | Studders | ............... | G06F 30/33 |
| 2018/0189440 A1* | 7/2018 | Sato | ............... | G06F 30/39 |
| 2018/0259857 A1* | 9/2018 | Zou | ............... | G06T 11/001 |
| 2018/0307792 A1* | 10/2018 | Kim | ............... | G06F 30/398 |
| 2019/0211475 A1* | 7/2019 | Ito | ............... | G06F 30/36 |
| 2020/0104457 A1* | 4/2020 | Chuang | ............... | G06F 30/392 |
| 2020/0104458 A1* | 4/2020 | Chuang | ............... | G06F 30/327 |
| 2020/0133117 A1* | 4/2020 | Chu | ............... | G06F 30/392 |
| 2020/0134131 A1* | 4/2020 | Tien | ............... | G06F 30/398 |

OTHER PUBLICATIONS

Chen et al.; A learning-based methodology for routability prediction in placement; 2018 International Symposium on VLSI Design, Automation and Test (VLSI-DAT); Conference Paper | Publisher: IEEE (Year: 2018).*

Zhou et al.; "An accurate detailed routing routability prediction model in placement"; 015 6th Asia Symposium on Quality Electronic Design (ASQED): Conference Paper | Publisher: IEEE (Year: 2015).*

* cited by examiner

RULE CHECK VIOLATION PREDICTION SYSTEMS AND METHODS

BACKGROUND

In an electronic circuit design process, one or more electronic design automation (EDA) tools may be utilized to design, optimize, and verify semiconductor device designs, such as circuit designs in a semiconductor chip. During placement, a placer tool may produce a placement layout based on a given circuit design, which may be developed by a circuit designer and which may include, for example, circuit design information such as electrical diagrams, high level electrical description of the circuit design, a synthesized circuit netlist, or the like. The placement layout includes information indicating physical positions of various circuit elements of the semiconductor device. After the placement of the device is completed, clock-tree synthesis and routing may be performed. During routing, wires or interconnections may be formed to connect the various circuit elements of the placement layout.

After the placement layout has been routed, the resulting electronic device design may be checked for compliance with various design rules, design specifications, or the like. For example, the electronic device design may be checked for various design rule check (DRC) violations. Some DRC violations may be caused by routing congestion, for example, as routing lines may become congested in certain regions of the electronic device design which can result in DRC violations. Routing congestion can significantly impede efforts to reduce or minimize chip size in various designs.

BRIEF DESCRIPTION OF THE SEVERAL VIEWS OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
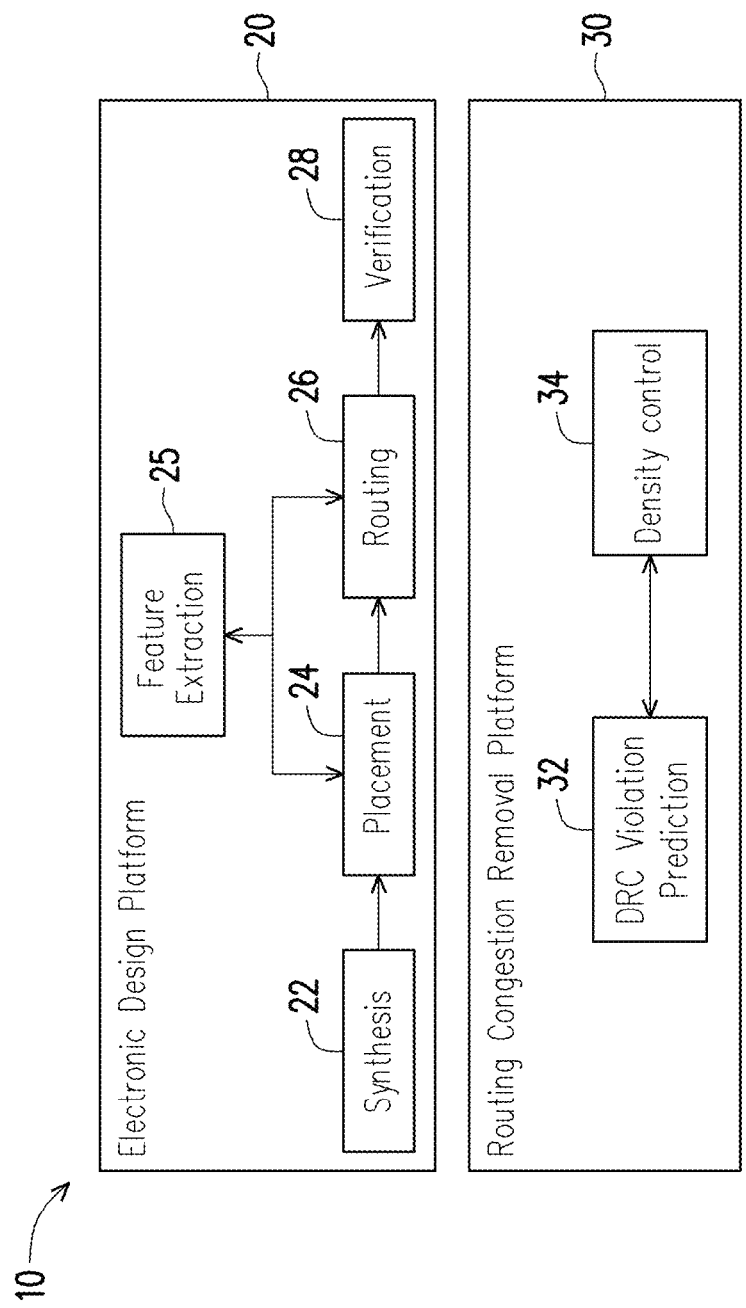
FIG. 1 is a block diagram illustrating an electronic device design system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments provided herein include design rule check (DRC) violation prediction systems and methods for predicting DRC violations in a placement layout before routing is performed on the placement layout. In some embodiments, machine learning techniques are utilized to produce routing congestion patterns, and DRC violation prediction circuitry may predict whether one or more systematic DRC violations would be present in a particular placement layout by comparing one or more regions of the placement layout with the routing congestion patterns.

FIG. 1 is a block diagram illustrating of an electronic device design system 10, in accordance with one or more embodiments of the present disclosure. The electronic device design system 10 is operable to generate and optimize placement layouts for an electrical device before routing of the placement layouts, and further is operable to perform routing of the generated and optimized placement layouts. The electronic device design system 10 includes an electronic design platform 20 and a routing congestion removal platform 30. In some embodiments, the electronic design platform 20 and/or the routing congestion removal platform 30 may be implemented in hardware, firmware, software, or any combination thereof. For example, in some embodiments, the electronic design platform 20 and/or the routing congestion removal platform 30 may be at least partially implemented as instructions stored on a computer-readable storage medium, which may be read and executed by one or more computer processors or processing circuitry. The computer-readable storage medium may be, for example, read-only memory (ROM), random access memory (RAM), flash memory, hard disk drive, optical storage device, magnetic storage device, electrically erasable programmable read-only memory (EEPROM), organic storage media, or the like.

The electronic design platform 20 may include a plurality of electronic device design tools that may be implemented at least in part as software tools which, when executed by one or more computing devices, processors, or the like, can be utilized to design and generate one or more electronic device layouts, including placement layouts and associated routing for electronic devices circuits, which may include, for example, one or more integrated circuits (ICs).

In some embodiments, the electronic design platform 20 and the routing congestion removal platform 30 may be included in or otherwise implemented by a same apparatus, such as a same computing system or device. In other embodiments, the electronic design platform 20 and the routing congestion removal platform 30 may be included in or otherwise implemented by separate apparatuses, such as separate and remotely located computing systems or devices.

The electronic design platform 20 includes electronic device design tools which can be used, for example, to design high-level programming descriptions of analog and/or digital circuitry for an electronic device. In some embodiments, the high-level programming descriptions can be implemented using a high-level programming language, such as C, C++, LabVIEW, MATLAB, a general purpose system design or modeling language, such as SysML, SMDL and/or SSDL, or any other suitable high-level programming language. In some embodiments, the electronic design platform 20 may include various additional features and functionalities, including, for example, one or more tools suitable to simulate, analyze, and/or verify the high-level programming descriptions of circuitry for the electronic device In some embodiments, the electronic design platform 20 includes a synthesis tool 22, a placement tool 24, and a routing tool 26, each of which may be implemented at least in part as software tools accessible to and executable by one or more computing devices, processors or the like.

The synthesis tool 22 translates one or more characteristics, parameters, or attributes of the electronic device into one or more logic operations, one or more arithmetic operations, one or more control operations, or the like, which may then be translated into the high-level programming descriptions in terms of the analog circuitry and/or the digital circuitry.

The placement tool 24 generates cells which correspond to, or otherwise implement, the one or more logic operations, one or more arithmetic operations, one or more control operations, or the like produced by the synthesis tool 22. The cells may include geometric shapes which correspond to various features of semiconductor devices, including, for example, diffusion layers, polysilicon layers, metal layers, and/or interconnections between layers.

In some embodiments, the placement tool 24 may provide one or more high-level software level descriptions of the geometric shapes, the locations of the geometric shapes, and/or the interconnections between the geometric shapes to a routing congestion removal platform 30, which may determine the presence of systematic design rule check (DRC) violations prior to routing the design generated by the placement tool 24.

In some embodiments, the geometric shapes for some of the analog circuitry and/or the digital circuitry can be defined in accordance with a standard cell from among a predefined library of standard cells associated with a technology library. The standard cell represents one or more semiconductor devices as well as their interconnection structures that are configured and arranged to provide a logical function, such as AND, OR, XOR, XNOR, or NOT, or a storage function, such as a flipflop or a latch. The predefined library of standard cells may be defined in terms of geometric shapes which correspond to diffusion layers, polysilicon layers, metal layers, and/or interconnections between layers. Thereafter, the placement tool 24 assigns locations for the geometric shapes on a printed circuit board (PCB) and/or a semiconductor substrate.

The electronic design platform 20 may perform clock tree synthesis (CTS) on a design generated, for example, by the placement tool 24. In some embodiments, the placement tool 24 may perform the clock tree synthesis. In other embodiments, a CTS tool may be included in the electronic design platform 20 to perform CTS on designs received from the placement tool 24. Clock tree synthesis generally refers to a process of synthesizing a clock tree to achieve zero or minimal skew and insertion delay, and may include inserting one or more buffers or inverters along clock paths of the electronic device design.

The routing tool 26 produces physical interconnections between the cells or the geometric shapes in the layout provided by the placement tool 24. In some embodiments, the routing tool 26 utilizes a textual or an image-based netlist describing the analog circuitry, the digital circuitry, the technology library, a semiconductor foundry for fabricating the electronic device and/or a semiconductor technology node for fabricating the electronic device to assign the interconnections between the geometric shapes.

The electronic design platform 20 may include a variety of additional tools, including, for example, a verification tool 28. The verification tool 28 may perform various verifications or checks on an electronic device layout, e.g., after placement and routing. For example, in some embodiments, the verification tool 28 can analyze the electronic device layout and can provide a static timing analysis (STA), a voltage drop analysis, also referred to an IREM analysis, a Clock Domain Crossing Verification (CDC check), a formal verification, also referred to as model checking, equivalence checking, or any other suitable analysis and/or verification. In some embodiments, the verification tool 28 can perform an alternating current (AC) analysis, such as a linear small-signal frequency domain analysis, and/or a direct current (DC) analysis, such as a nonlinear quiescent point calculation or a sequence of nonlinear operating points calculated while sweeping a voltage, a current, and/or a parameter to perform the STA, the IREM analysis, or the like.

The verification tool 28 verifies that the electronic device design, including the layout of the cells or geometric shapes provided by the placement tool 24, as well as the interconnections between the cells or geometric shapes provided by the routing tool 26, satisfies one or more specifications, rules, or the like associated with the electronic device design. The verification tool 28 may perform a physical verification, in which the verification tool 28 verifies whether an electronic device design is physically manufacturable, and that the resulting chips will meet the design specifications and will not have physical defects which prevent the chips from functioning as designed.

The verification tool 28 may perform a design rule check (DRC) to determine whether the electronic device design, including the geometric shapes, the locations of the geometric shapes, and/or the interconnections between the geometric shapes assigned by the placement tool 24 and/or the routing tool 26, satisfies a series of recommended parameters, referred to as design rules, as may be defined by a semiconductor foundry and/or semiconductor technology node for fabricating the electronic device. The verification tool 28 may determine the presence of one or more DRC violations in the electronic device design, and in some embodiments, the verification tool 28 may generate a DRC-violation map indicating a location of the one or more DRC violations in the electronic device design.

In some embodiments, the routing congestion removal platform 30 is configured to predict or determine the presence of DRC violations in a particular electronic circuit placement layout, for example, as may be provided from the placement tool 24, prior to routing of the placement layout by the routing tool 26. As will be discussed in further detail herein, the routing congestion removal platform 30 may predict or determine the presence of DRC violations by implementing one or more machine learning approaches, for example, in which past data (such as data indicating presence and/or locations of DRC violations in electronic device designs after routing has been performed) is utilized to train a machine learning model to predict or determine the presence of DRC violations based on similarities or deviations between new electronic circuit placement layouts (e.g., before routing is performed) and the past data.

The routing congestion removal platform 30 may include a plurality of electronic device analysis and/or design tools which may be implemented at least in part as software tools which, when executed by one or more computing devices, processors, or the like, can be utilized to analyze one or more electronic device layouts, including placement layouts for electronic devices or circuits which may be received, for example, from the electronic design platform 20 (e.g., from the placement tool 24). Additionally, in some embodiments, the routing congestion removal platform 30 may be utilized to adjust or otherwise provide information to the electronic design platform 20 which indicates one or more adjustments to be made to the placement layout in order to avoid or otherwise reduce the presence of DRCs in the placement layout once the placement layout has been routed, for example, by the routing tool 26.

In some embodiments, the routing congestion removal platform 30 includes a DRC violation prediction tool 32, and a density control tool 34, each of which may be implemented at least in part as software tools accessible to and executable by one or more computing devices, processors or the like. In some embodiments, the DRC violation prediction tool 32 and/or the density control tool 34 may be implemented as circuitry operable to perform any of the functions described herein with respect to the DRC violation prediction tool 32 and/or the density control tool 34. In some embodiments, the electronic design platform 20 and the routing congestion removal platform 30 may be integrated, and may be implemented in a same platform. For example, each of the various tools described herein with respect to the electronic design platform 20 and the routing congestion removal platform 30 may be accessed or otherwise implemented, at least in part, by a same apparatus, such as a computer device.

In some embodiments, the routing congestion removal platform 30 receives placement layouts from the electronic design platform 20 before routing of the placement layouts is performed, for example, by the routing tool 26. The routing congestion removal platform 30 may implement a machine-learning approach to predict or determine the presence of systematic DRC violations in the placement layouts, and to adjust or otherwise provide an indication of one or more recommended adjustments to the placement layout in order to optimize or improve a routability of the placement layout. For example, the DRC violation prediction tool 32 may receive the placement layouts from the electronic design platform 20 before routing is performed, and the DRC violation prediction tool 32 may implement a machine-learning approach to predict or determine the presence of systematic DRC violations in the placement layouts, for example, based on past data which may be used to train a machine-learning circuit or circuitry to predict or determine the presence of systematic DRC violations based on similarities or deviations between the past data (e.g., data indicative of DRC violations in electronic device designs after routing has been performed) and the received placement layouts. As will be described in further detail below, in some embodiments, the DRC violation prediction tool 32 may include machine learning circuitry 110 which may be trained to predict or determine the presence of systematic DRC violations based on input training data 120 (e.g., past data which represents or indicates the presence and locations of systematic DRC violations in electronic device designs after routing has been performed). The density control tool 34 may also receive the placement layouts and may further receive location or other data associated with the predicted or determined systematic DRC violations from the DRC violation prediction tool 32. The density control tool 34 may adjust or recommend adjustments to the placement layout in order to optimize or improve a routability of the placement layout, based on the predicted or determined systematic DRC violations.

In some embodiments, systematic DRC violations due to routing congestion may be predicted or determined before routing of the layout is performed. A systematic DRC violation may refer to an identified or predicted DRC violation having a high probability of occurrence based on one or more characteristics or features of the particular placement layout. Moreover, a systematic DRC violation may refer to an identified region of a placement layout which is predicted or determined to have a high probability of occurrences of one or more DRC violations.

Figure 2:
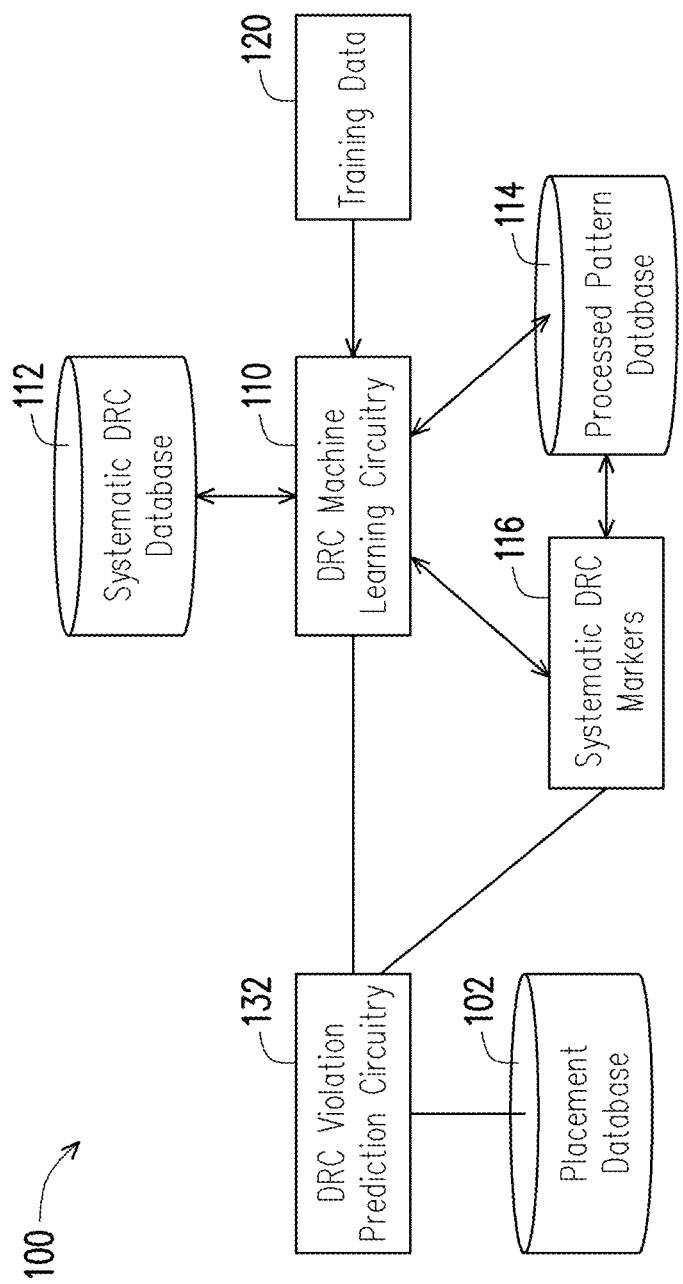
FIG. 2 is a block diagram illustrating a design rule check (DRC) violation prediction system, in accordance with some embodiments.

FIG. 2 is a block diagram illustrating a DRC violation prediction system 100, in accordance with embodiments of the present disclosure. The DRC violation prediction system 100 may be used in conjunction with, and may include one or more of the features and functionality of, the routing congestion removal platform 30 shown in FIG. 1. In some embodiments, the DRC violation prediction system 100 is included in or implemented by the routing congestion removal platform 30. For example, in some embodiments, the DRC violation prediction system 100 may be implemented or otherwise accessed by the DRC violation prediction tool 32 to predict or determine the presence of systematic DRC violations in the placement layouts received, for example, from the placement tool 24 of the electronic design platform 20.

As shown in FIG. 2, the DRC violation prediction system 100 includes DRC violation prediction circuitry 132 and a placement database 102. The DRC violation prediction circuitry 132 may include, or otherwise be executed by, a computer processor configured to perform the various functions and operations described herein. For example, the DRC violation prediction circuitry 132 may be executed by a computer processor selectively activated or reconfigured by a stored computer program, or may be a specially constructed computing platform for carrying out the features and operations described herein.

In some embodiments, the DRC violation prediction circuitry 132 includes memory which stores instructions for performing one or more of the features or operations described herein, and the DRC violation prediction circuitry 132 may be operable to execute instructions stored, for example, in the memory to perform the functions of the DRC violation prediction circuitry 132 described herein. The memory may be or include any computer-readable storage medium, including, for example, read-only memory (ROM), random access memory (RAM), flash memory, hard disk drive, optical storage device, magnetic storage device, electrically erasable programmable read-only memory (EEPROM), organic storage media, or the like.

The DRC violation prediction circuitry 132 may be communicatively coupled to the placement database 102. The DRC violation prediction circuitry 132 may access placement layouts from the placement database 102. The placement layouts stored in the placement database 102 may be provided, for example, from the placement tool 24 of the electronic design platform 20. The placement database 102 may be stored in one or more computer-readable memories.

The DRC violation prediction circuitry 132 analyzes a placement layout retrieved from the placement database 102 to predict or determine the presence of systematic DRC violations in the placement layout, for example, based on a comparison of the retrieved placement layout with past data or analysis of the retrieved placement layout by a machine learning model that is trained with past data indicative of DRC violations in electronic device designs after routing has been performed. In some embodiments, the DRC violation prediction circuitry 132 may separately inspect each of a plurality of regions of the placement layout. The inspected regions of the placement layout may have any size and/or shape. For example, and as described in further detail below with respect to FIG. 5, the placement layout may be divided into regions based on an inspection grid, and each cell or unit of the grid may have a size that corresponds to a size of each of the regions of the placement layout.

The DRC violation prediction circuitry 132 may inspect each region of a placement layout separately, region-by-region, and may predict or determine based on past data (e.g., training data that is utilized to train the machine learning circuitry 110), for each inspected region, whether one or more systematic DRC violations would be present in the inspected region, for example, after routing is performed on the placement layout by a subsequent routing process.

In some embodiments, the DRC violation prediction circuitry 132 may predict or determine the presence of systematic DRC violations in the placement layouts by employing one or more artificial intelligence or machine learning techniques, which in some embodiments may be implemented at least in part by the DRC machine learning circuitry 110. Some or all of the determinations described herein that are made by the DRC violation prediction circuitry 132 may be performed automatically by the DRC violation prediction circuitry 132, for example, in response to receiving a placement layout from the placement database 102. The machine learning circuitry 110 may predict or determine the presence of systematic DRC violations in the placement layouts by using past data (e.g., the machine learning circuitry 110 may be trained based on past data) which indicates the presence and locations of systematic DRC violations in electronic device designs after routing has been performed, and the machine learning circuitry 110 may compare the received placement layouts with the past data to predict or determine the presence of DRC violations based on similarities or deviations from the past data or from a trained model contained within, managed by, or otherwise accessible to the machine learning circuitry 110.

"Artificial intelligence" is used herein to broadly describe any computationally intelligent systems and methods that can learn knowledge (e.g., based on training data), and use such learned knowledge to adapt its approaches for solving one or more problems, for example, by making inferences based on a received input, such as placement layouts. Machine learning generally refers to a sub-field or category of artificial intelligence, and is used herein to broadly describe any algorithms, mathematical models, statistical models, or the like that are implemented in one or more computer systems or circuitry, such as processing circuitry, and which build one or more models based on sample data (or training data) in order to make predictions or decisions.

The DRC violation prediction circuitry 132 and/or the DRC machine learning circuitry 110 may employ, for example, neural network, deep learning, convolutional neural network, Bayesian program learning, support vector machines, and pattern recognition techniques to solve problems such as predicting or determining the presence of systematic DRC violations in a placement layout. Further, the DRC violation prediction circuitry 132 and/or the DRC machine learning circuitry 110 may implement any one or combination of the following computational algorithms and/or techniques: classification, regression, supervised learning, unsupervised learning, feature learning, clustering, decision trees, or the like.

As one example, an artificial neural network may be utilized by the DRC violation prediction circuitry 132 and/or the DRC machine learning circuitry 110 to develop, train, and/or update a model which may be utilized to predict or determine the presence of systematic DRC violations in a placement layout. An example artificial neural network may include a plurality of interconnected "neurons" which exchange information between each other. The connections have numeric weights that can be tuned based on experience, and thus neural networks are adaptive to inputs and are capable of learning. The "neurons" may be included in a plurality of separate layers which are connected to one another, such as an input layer, a hidden layer, and an output layer. The neural network may be trained by providing training data (e.g., past data which indicates the presence and locations of systematic DRC violations in electronic device designs after routing has been performed) to the input layer. Through training, the neural network may generate and/or modify the hidden layer, which represents weighted connections mapping the training data provided at the input layer to known output information at the output layer (e.g., classification of an input electronic device design after routing has been performed as including one or more systematic DRC violations and their locations). Relationships between neurons of the input layer, hidden layer, and output layer, formed through the training process and which may include weight connection relationships, may be stored, for example, as a machine learning model within or otherwise accessible to the DRC machine learning circuitry 110.

Once the neural network has been sufficiently trained, the neural network may be provided with non-training data (e.g., new placement layout data prior to routing) at the input layer. Utilizing systematic DRC violation knowledge (e.g., as stored in the machine learning model, and which may include, for example, weighted connection information between neurons of the neural network), the neural network may make determinations about the received placement layout at the output layer. For example, the neural network may predict or determine the presence of one or more systematic DRC violations in the placement layout.

Employing one or more computationally intelligent and/or machine learning techniques, the DRC violation prediction circuitry 132 may learn (e.g., by developing and/or updating a machine learning algorithm or model based on training data) to predict or determine the presence of systematic DRC violations in a placement layout, and in some embodiments, the DRC violation prediction circuitry 132 may make some predictions or determinations based at least in part on knowledge, inferences or the like developed or otherwise learned through training of the DRC machine learning circuitry 110.

The DRC machine learning circuitry 110 may be implemented in one or more processors having access to instructions, which may be stored in any computer-readable storage medium, which may be executed by the DRC machine learning circuitry 110 to perform any of the operations or functions described herein.

In some embodiments, the DRC machine learning circuitry 110 is communicatively coupled to a systematic DRC database 112, which may be stored, for example, in any computer-readable storage medium. The systematic DRC database 112 may include information that associates systematic DRC violations with one or more of a placement (e.g., an entire placement layout grid for an electronic device design), a placement region (e.g., a plurality or grouping of neighboring grid cells or units), or a placement sub-region (e.g., a single grid cell or unit). In some embodiments, the systematic DRC database 112 includes information indicating a probability of one or more systematic DRC violations in a particular placement, placement region, placement sub-region, or the like. The historical systematic DRC database may further include information associated with locations or occurrences of systematic DRC cluster patterns in one or more placement layouts, regions, sub-regions, or the like.

The information stored in the systematic DRC database 112 may be derived from a plurality of electronic device designs, which may include the placement layout (e.g., as provided by the placement tool 24), as well as the routing or interconnections between cells or geometric shapes of the placement layout (e.g., as provided by the routing tool 26). Thus, the information stored in the systematic DRC database 112 may represent actual DRC violations that have been determined to be present in actual electronic device designs, e.g., after routing has been performed.

In some embodiments, the DRC machine learning circuitry 110 may be trained based on training data 120, which may be provided, for example, from the systematic DRC database 112. The DRC machine learning circuitry 110 may be trained, for example, by providing it with input training data 120 (e.g., past data which represents or indicates the presence and locations of systematic DRC violations in electronic device designs after routing has been performed). For example, in some embodiments, the DRC machine learning circuitry 110 may be trained based on information stored in the systematic DRC database 112, which may represent DRC violations that have been determined to be present in actual electronic device designs, and the algorithm or machine learning model contained within or accessible to the DRC machine learning circuitry 110 may be updated or modified based on the information stored in the systematic DRC database 112, so that the trained DRC machine learning circuitry 110 may identify, predict, or determine the presence and locations of systematic DRC violations in new placement layouts that have not been routed. In some embodiments, the DRC machine learning circuitry 110 may receive training data 120 and may be trained based on the training data 120, and may store information in the systematic DRC database 112 as a result of the training. For example, the DRC machine learning circuitry 110 may generate, modify, or adjust a machine learning model stored in the systematic DRC database 112 based on training of the DRC machine learning circuitry 110 by the training data 120. For example, the machine learning model may be modified to identify presence and locations of systematic DRC violations based on a correspondence (e.g., a similarity or deviation) between known layout structures and positions of known systematic DRC violations.

In some embodiments, the training data 120 and/or the information stored in the systematic DRC database 112 may be or include labeled training data from which the DRC machine learning circuitry 110 and/or the DRC violation prediction circuitry 132 may learn to predict or determine the presence of systematic DRC violations in a placement layout (e.g., prior to routing of the placement layout). The labeled training data may include labels associated with feature classes, and the labels may indicate any of a plurality of features or feature classes in the training data. Such features may include any features associated with a placement layout, including, for example, a number of cells in the placement layout and/or a number of cells in a region or grid of a placement layout, a number of nets in a placement layout and/or in a region or grid of a placement layout, a number of multi-height cells in a region or grid of a placement layout. In some embodiments, the labels may indicate a probability of a DRC violation existing in a placement layout and/or in a region or grid of a placement layout.

In some embodiments, the training data 120 may include manually-entered input, such as one or more variable or adjustable parameters, coefficient values, labels, classifiers, or the like, to adjust or otherwise manage the DRC violation prediction model developed in the DRC machine learning circuitry 110 and/or stored in the systematic DRC database 112 through the training process.

In some embodiments, the DRC machine learning circuitry 110 may be trained to identify and/or generate clustered DRC patterns based on the training data 120 and/or the information stored in the systematic DRC database 112. The DRC machine learning circuitry 110 may analyze the received training data 120 and/or the information stored in the systematic DRC database 112 and may identify or generate the clustered DRC patterns using cosine similarity to determine a similarity between predicted or determined DRC violations. Cosine similarity, in general, is a measure of similarity between two non-zero vectors of an inner product space that measures the cosine of the angle between them. The cosine of 0° is 1, and it is less than 1 for any angle in the interval [0, π] radians. Cosine similarity therefore provides a judgment of similarity between two vectors in terms of orientation. For example, two vectors with the same orientation have a cosine similarity of 1, while two vectors oriented at 90° relative to each other have a similarity of 0, independent of their magnitude. Cosine similarity may be utilized by the DRC machine learning circuitry 110, for example, by comparing cosines of angles between a plurality of vectors, where each of the vectors represents a position of a particular identified DRC violation (e.g., in vector format, such as a vector between a reference position coordinate (e.g., (0, 0, 0)) and a position coordinate of the DRC violation (e.g., (x, y, z)).

Training may be based on a wide variety of learning algorithms or models, including, for example, support vector machines, linear regression, logistic regression, naive Bayes, linear discriminant analysis, decision trees, k-nearest neighbor, neural networks, or the like. An example of training of the DRC machine learning circuitry 110 based on a neural network is provided previously herein.

In some embodiments, the DRC machine learning circuitry 110 may implement or be trained based on a regression method with design and pattern set ensembles, as will be described in further detail herein, for example, with respect to FIGS. 7A and 7B. A regression method may be any regression analysis technique which may be used to estimate the relationships among variables, such as a relationship between the presence of DRC violations in a placement layout and one or more features associated with the placement layout which may be statistically related to the presence of DRC violations (e.g., a number of network nodes or nets, a number of cells, a number of multi-height cells, cell density, fan-in or fan-out information, or the like within a particular region or area of the placement layout).

The design sets may be trained with entire layout grids (e.g., entire placement layouts after routing has been performed, including information indicative of presence and location of systematic DRC violations), to produce one or more "global" models (see FIG. 7A), each of which may be utilized to predict or determine the presence and locations of DRC violations for an entire particular placement layout. The pattern sets may be trained with clustered grids in similar feature distance (e.g., sub-regions of placement layouts after routing has been performed in which clusters of DRC violations have been identified, for example, by cosine similarity), to produce one or more "local" models (see FIG. 7B), each of which may be utilized to predict or determine the presence and locations of DRC clusters or regions of a placement layout in which a plurality of proximate DRC violations are predicted or determined to occur. The clustered grids may represent one or more grid regions or a grouping of neighboring grid cells having a clustered DRC pattern, e.g., indicating that a plurality of DRC violations may be present in the clustered grid or that one or more DRC violations are likely to occur in the clustered grid.

In some embodiments, the DRC machine learning circuitry 110 may generate, based on the training (e.g., based on training input including past data indicative of presence and location of DRC violations in placement layouts after routing has been performed), a plurality of processed patterns (or pattern models, or local models) which may be stored in a processed pattern database 114. The processed patterns may represent grid structures (e.g., one or more grids or grid regions of a placement layout) that are prone to systematic DRC violations. In some embodiments, the processed patterns represent clustered DRC patterns, or grid cells or groupings of neighboring grid cells which exhibit systematic DRC violations.

Systematic DRC markers 116 (which may indicate, for example, a high probability of occurrence of systematic DRC violations associated with one or more extracted features, a pattern, or a pattern model) may be generated, for example, based on the pattern models stored in the processed pattern database 114. The systematic DRC markers 116 may be stored, for example, in a database accessible by the DRC machine learning circuitry 110, and in some embodiments, the systematic DRC markers 116 may be stored in the processed pattern database 114.

In some embodiments, the DRC violation prediction circuitry 132 and/or the DRC machine learning circuitry 110 may predict or determine the presence of one or more systematic DRC violations in a particular placement layout or layout region based at least in part on the systematic DRC markers 116, for example, by comparing or otherwise analyzing the particular placement layout or layout region with respect to the systematic DRC markers 116.

Referring again to FIG. 1, the density control tool 34 may adjust an analyzed placement layout based on a predicted or determined presence of and/or location of DRC violations that would exist in the placement layout after routing the placement layout, e.g., by the routing tool 26. In some embodiments, the density control tool 34 may receive the locations of predicted or determined DRC violations from the DRC violation prediction tool 32, which may utilize or implement the DRC violation prediction system 100 shown in FIG. 2 to predict or determine the presence of and/or locations of DRC violations in the placement layout.

The density control tool 34 may, for example, increase the spacing between cells in a region of the placement layout in which one or more DRC violations were predicted or determined to be present, in order to remove or avoid the DRC violations.

Figure 3A:
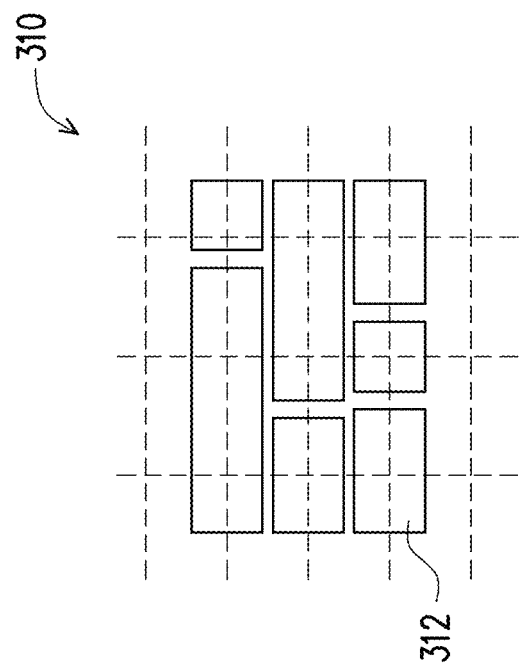
FIG. 3A is a schematic diagram illustrating a region of a placement layout in which one or more DRC violations are predicted or otherwise determined to be present, in accordance with some embodiments.

FIG. 3A is a schematic diagram illustrating a region 310 of a placement layout in which one or more DRC violations were predicted or otherwise determined to be present. For example, the routing congestion removal platform 30 and/or the DRC violation prediction system 100 may analyze a placement layout, and may predict or determine that one or more DRC violations would exist in the region 310 of the placement layout if the placement layout were to proceed to routing, e.g., by the routing tool 26.

The region 310 may include any number of cells 312. In the example shown in FIG. 3A, the region 310 includes seven cells which are positioned within a 4×4 grid. However, it should be appreciated that the regions of placement layouts which may be analyzed by the routing congestion removal platform 30 and/or the DRC violation prediction system 100 may have various sizes and may include any number of grid units or grid cells, and further may include any number of cells 312, which may be cells generated and placed by the placement tool 24 and which may be provided as geometric shapes representative of a grouping of semiconductor devices which together perform or provide one or more logical functions. Moreover, as shown in FIG. 3A, the cells 312 may have a variety of different sizes, with some cells being larger or smaller than other cells in the region 310. Although the cells 312 are shown in FIG. 3A as being rectangular in shape, it should be appreciated that embodiments of the present disclosure are not limited thereto, and in various embodiments, the cells 312 of a placement layout may have any suitable shape.

The density of the cells 312 within the region 310 is relatively high, with seven cells 312 positioned within the 4×4 grid. In order to remove or avoid the predicted DRC violations that would exist in the region 310 if the placement layout were to be routed, the density control tool 34 may increase the spacing between the cells 312, for example, as shown in FIG. 3B.

Figure 3B:
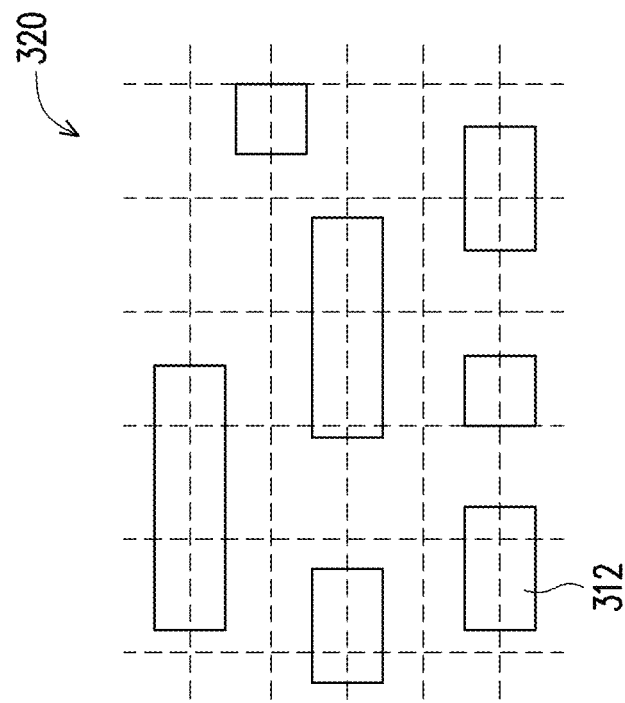
FIG. 3B is a schematic diagram illustrating a region in which a spacing between cells is increased in response to DRC violations being predicted or determined to be present, in accordance with some embodiments.

FIG. 3B is a schematic diagram illustrating a region 320 in which the same cells 312 of the region 310 shown in FIG. 3A are positioned, but with increased spacing between the cells 312. For example, as shown in FIG. 3B, the seven cells 312 may be positioned within a 6×6 grid region of the placement layout. Each grid unit or grid cell of the 6×6 grid shown in FIG. 3B may have a same size as the grid units or grid cells of the 4×4 grid shown in FIG. 3A. However, the size of the region 320 is increased with respect to the size of the region 310 in order to provide increased spacing between the cells 312 and thereby reduce or eliminate the likelihood of DRC violations from occurring in the region 320.

In some embodiments, the density control tool 34 may itself adjust the placement layout, for example, by increasing the spacing between cells 312 of a region that is predicted or determined to have one or more DRC violations. In other embodiments, the density control tool 34 may instruct or otherwise cause the electronic design platform 20 (e.g., the placement tool 24) to increase the spacing between cells 312 of the placement layout in order to avoid or eliminate the predicted or determined DRC violations. For example, in some embodiments, the density control tool 34 may increase spacing between cells 312 along both an x-axis direction (e.g., horizontally, as shown in FIGS. 3A and 3B) and a y-axis direction (e.g., vertically, as shown in FIGS. 3A and 3B). The spacing between adjacent cells 312 may be increased by any factor, such as, for example, 0.5 times, 1 times, or 2 times, in various embodiments.

In some embodiments, the routing congestion removal platform 30 and/or the DRC violation prediction system 100 may provide feedback to the electronic design platform 20 (e.g., to the placement tool 24) based on the predicted or determined DRC violations in a placement layout. Such feedback may be utilized to optimize or otherwise improve a placement recipe which may be utilized by the placement tool 24 to generate or produce subsequent placement layouts which are less likely to have DRC violations.

Figure 4:
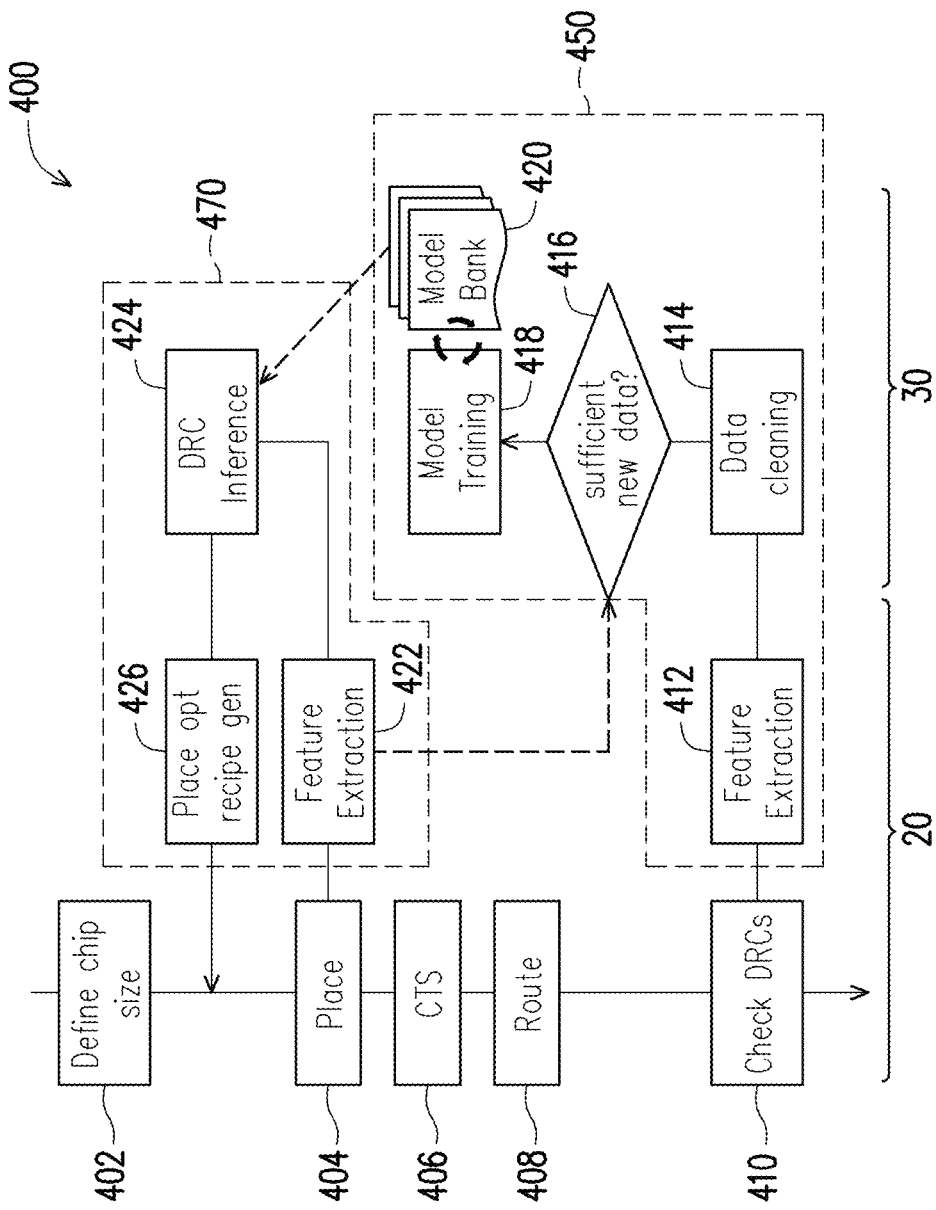
FIG. 4 is a flow chart illustrating an electronic device design method, in accordance with some embodiments.

FIG. 4 is a flow chart 400 illustrating an electronic device design method, in accordance with one or more embodiments. The electronic device design method may be implemented, for example, by the electronic design platform 20 and the routing congestion removal platform 30 shown in and described with respect to FIG. 1.

At 402, a size of the electronic device (e.g., a chip size) is defined. The chip size may be defined, for example, based on one or more specifications, rules, or the like associated with the electronic device design. In some embodiments, the chip size may be defined by a designer of the chip based, for example, on one or more design specifications developed for the chip.

At 404, placement of the electric device is performed, for example, by the placement tool 24 of the electronic design platform 20. For example, the placement tool 24 may generate a placement layout including a plurality of cells which correspond to, or otherwise implement, the one or more logic operations, one or more arithmetic operations, one or more control operations, or the like produced by the synthesis tool 22. The cells may include or be provided as geometric shapes (such as cells 312 shown in FIGS. 3A and 3B).

At 406, clock tree synthesis (CTS) is performed on the placement layout generated at 404. For example, the electronic design platform 20 may perform CTS on a design generated by the placement tool 24. In some embodiments, the placement tool 24 may perform the CTS. In other embodiments, a CTS tool may be included in the electronic design platform 20 to perform CTS on designs received from the placement tool 24.

At 408, routing is performed on the placement layout after the CTS is performed at 406. For example, the routing tool 26 of the electronic design platform 20 may perform routing on the placement layout by generating interconnections (or routings) between the cells or the geometric shapes in the placement layout provided by the placement tool 24 after the CTS has been performed. As a result of the routing, an electronic device layout is produced which includes, for example, the placement layout and the interconnections provided by the routing.

At 410, the electronic device layout is checked for DRC violations after the electronic device layout has been produced, for example, after the routing at 408. In some embodiments, the electronic device layout may be checked for DRC violations by the verification tool 28 of the electronic design platform 20. The verification tool 28 may determine the presence of one or more DRC violations in the electronic device design, and in some embodiments, the verification tool 28 may generate a DRC-violation map indicating a location (e.g., x- and y-axis location) of the one or more DRC violations in the electronic device design.

The flowchart 400 includes a model training branch 450, in which the results of the DRC checking at 410 may be utilized to train a machine learning model, such as a machine learning model implemented by the DRC violation prediction circuitry 132 and/or the DRC machine learning circuitry 110 and which may be at least partially stored, for example, in the systematic DRC database 112 and/or the processed pattern database 114. In some embodiments, the results of the DRC checking at 410 may be included as training data 120 for training the machine learning model.

At 412, feature extraction is performed on the electronic device layout after the electronic device layout has been checked for DRC violations at 410. In some embodiments, feature extraction may be performed by the electronic design platform 20. For example, the electronic design platform 20 may include a feature extraction tool 25 which extracts information associated with one or more features of the electronic device layout. The extracted features may include any characteristics or parameters associated with the electronic device layout. In some embodiments, the feature extraction tool 25 analyzes a plurality of regions of the electronic device layout and extracts features associated with each of the plurality of regions. For example, the feature extraction tool 25 may perform feature extraction on each of a plurality of grid units of the electronic device layout and/or on each of a plurality of neighboring grid units of the electronic device layout. The feature extraction tool 25 may be implemented at least in part as software tools accessible to and executable by one or more computing devices, processors or the like. In some embodiments, the feature extraction tool 25 may be implemented as circuitry operable to perform any of the functions described herein with respect to the feature extraction tool 25.

Figure 5:
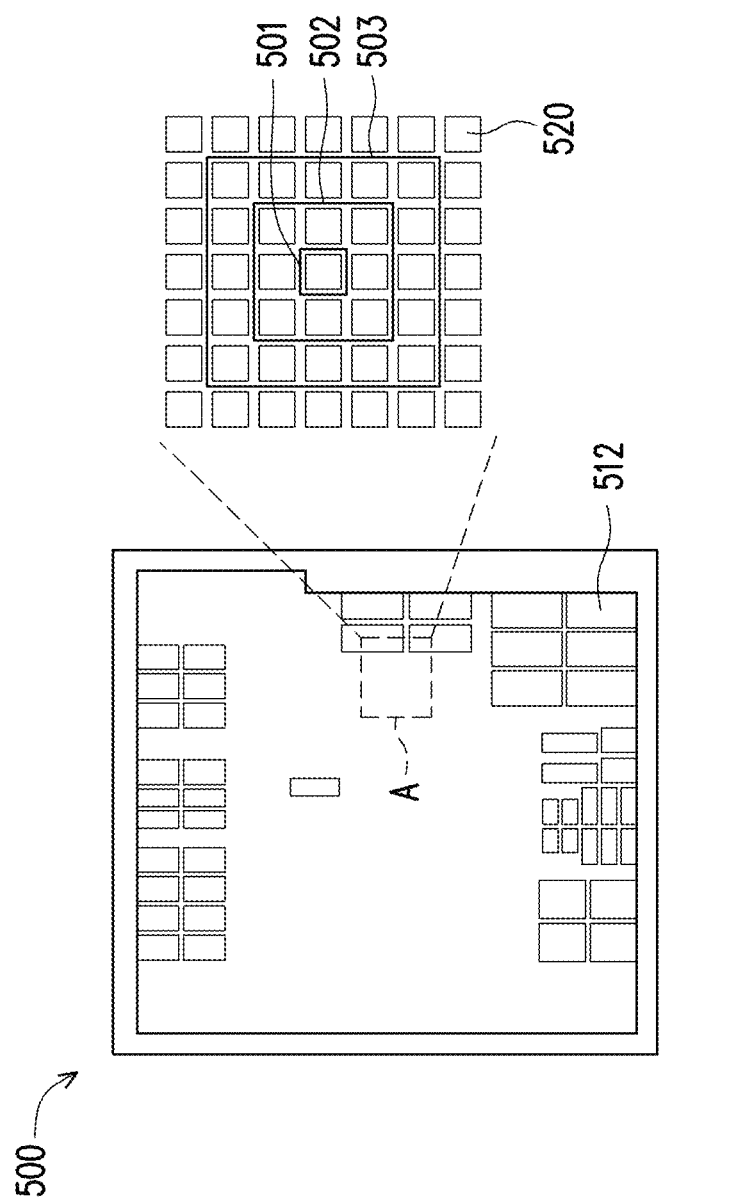
FIG. 5 is a diagram illustrating an example electronic device layout, in accordance with some embodiments.

FIG. 5 is a diagram illustrating an example electronic device layout 500, which may be produced by the electronic design platform 20, for example, after routing by the routing tool 26. The electronic device layout 500 includes a plurality of cells 512, which may be cells generated and placed by the placement tool 24 and which may be provided as geometric shapes representative of a grouping of semiconductor devices which together perform or provide one or more logical functions. In the example shown in FIG. 5, only some of the cells 512 that are included in the electronic device layout 500 are illustrated, and it should be readily appreciated that additional cells 512 may be included in the electronic device layout 500.

An enlarged region "A" of the electronic device layout 500 is pictured in FIG. 5. As can be seen in the region "A", a grid may be overlaid on the electronic device layout 500, and the grid may include a plurality of grid units or grid cells 520.

The feature extraction tool 25 may analyze and extract features from the electronic device layout 500 on a region-by-region basis, and the regions may have any suitable size. For example, the feature extraction tool 25 may extract features of each of a plurality of first regions 501 of the electronic device layout 500, which may be the individual grid cells 520 of the electronic device layout 500. In some embodiments, the feature extraction tool 25 may extract features of each of a plurality of second regions 502 of the electronic device layout 500, which may be 3×3 grid cell groupings or regions of the electronic device layout 500. In some embodiments, the feature extraction tool 25 may extract features of each of a plurality of third regions 503 of the electronic device layout 500, which may be 5×5 grid cell groupings or regions of the electronic device layout 500. It should be readily appreciated that any size of regions (e.g., any size of grid cell groupings or regions) may be analyzed by the feature extraction tool 25 to extract features of the electronic device layout 500. In some embodiments, the feature extraction tool 25 may extract features from each of a particular set of regions, such as the first regions 501, and may further extract features from each of a particular set of second regions, such as the second regions 502, which surround the first regions 501. That is, the feature extraction may be performed on a variety of different window sizes or sizes of regions which are analyzed. This may allow the feature extraction tool 25 to capture the influence of overlapping regions or neighboring regions on a particular region of interest, such as a particular grid cell or first region 501.

The features that are extracted may include any characteristics or parameters associated with the electronic device layout, and in some embodiments, may include DRC violation information associated with any of the extracted features. For example, the extracted features may include a number of network nodes or nets, a number of cells 512, a number of multi-height cells, cell density, fan-in or fan-out information, or the like within each analyzed region (e.g., a first region 501, a second region 502 and/or a third region 503) of the electronic device layout 500.

Referring again to the model training branch 450 of the flowchart 400, at 414, data cleaning is performed on the data associated with the features that are extracted by the feature extraction at 412. Data cleaning may include any processing, translation, or formatting of the extracted feature data to render the extracted feature data into a format suitable for use in training the machine learning model, such as the machine learning model implemented by the DRC violation prediction circuitry 132 and/or the DRC machine learning circuitry 110 and which may be at least partially stored, for example, in the systematic DRC database 112 and/or the processed pattern database 114. The data cleaning at 414 may be performed by the routing congestion removal platform 30, for example, by the DRC machine learning circuitry 110.

At 416, the data processed by the data cleaning at 414 is analyzed to determine whether the data (e.g., the extracted feature data) represents sufficient new data for training the model. The data may be determined to represent sufficient new data, for example, if the data is different from data that is already stored, for example, in the systematic DRC database 112 and/or the processed pattern database 114. The analysis and determination at 416 of whether the data represents sufficient new data may be performed by the routing congestion removal platform 30, for example, by the DRC machine learning circuitry 110.

In response to determining at 416 that the extracted feature data that is cleaned by the data cleaning represents sufficient new data for training the model, the data is provided for model training at 418. Data "cleaning" generally refers to processing or converting the data into a format which is usable by the machine learning model, and in some embodiments, may include detecting, correcting, or removing corrupt or inaccurate records from the data. The model training may be performed, for example, by the DRC violation prediction circuitry 132 and/or the DRC machine learning circuitry 110, and the model training may train the model which may be at least partially stored, for example, in the systematic DRC database 112 and/or the processed pattern database 114. In the flowchart 400, the machine learning model is represented as the model bank at 420. The model bank 420 may store a plurality of machine learning models utilized to predict the presence of one or more DRC violations in a placement layout, and may include global and/or local models. In some embodiments, the model bank includes models indicative of DRC violations in one or more regions or sub-regions (e.g., a single grid cell or a grouping of neighboring grid cells) of a placement layout and/or of an electronic device design.

The model bank 420 may be implemented by the DRC violation prediction circuitry 132 and/or the DRC machine learning circuitry 110 to predict or determine whether one or more systematic DRC violations are present in a particular placement layout, for example, before routing is performed.

For example, referring again to 404, once the model bank 420 has been sufficiently trained subsequent placement layouts generated at 404 may be provided to a DRC violation prediction branch 470 of the flowchart 400, as will be described in further detail below.

After a placement layout is generated at 404, for example, by the placement tool 24 of the electronic design platform 20, feature extraction may be performed at 422, for example, by the feature extraction tool 25. Feature extraction at 422 may include some or all of the features or functionalities described herein with respect to feature extraction at 412. For example, the feature extraction at 422 may be performed based on one or more first regions 501, second regions 502, and/or third regions 503 as shown and described with respect to FIG. 5. The features extracted at 422 may include any characteristics or parameters associated with the placement layout, e.g., before routing is performed on the placement layout. The extracted features may include features associated with or indicating a number of network nodes or nets, a number of cells 512, a number of multi-height cells, cell density, fan-in or fan-out information, or the like within each analyzed region of the placement layout. Information associated with the features extracted at 422 may be provided to the routing congestion removal platform 30 which may predict or determine, for example, by the DRC violation prediction circuitry 132 and/or the DRC machine learning circuitry 110, whether one or more systematic DRC violations are present in the particular placement layout.

The DRC violation prediction circuitry 132 and/or the DRC machine learning circuitry 110 may predict or determine whether one or more systematic DRC violations are present in the particular placement layout by making DRC inferences at 424. The DRC violation prediction circuitry 132 and/or the DRC machine learning circuitry 110 may infer (e.g., predict or determine) that one or more DRC violations are present in the placement layout by comparing features extracted from and associated with each region of the placement layout with DRC-associated information stored in the model bank 420. For example, the DRC violation prediction circuitry 132 and/or the DRC machine learning circuitry 110 may compare the features of the placement layout with the model bank 420 which may include information indicating that one or more systematic DRC violations are present in a particular region having certain features or characteristics.

Making DRC inferences at 424 may include analyzing each region of the placement layout, region-by-region, to predict or determine whether one or more systematic DRC violations are present. If none of the regions of the placement layout are predicted to have systematic DRC violations, then the placement layout may be considered to be a valid or routable placement layout which may then proceed to routing of the placement layout, for example, by the routing tool 26.

On the other hand, if one or more systematic DRC violations are predicted to be present in the inspected region, the DRC violation prediction circuitry 132 and/or the DRC machine learning circuitry 110 may determine an actual location, e.g., a geographical location on a particular placement layout, where a cluster of systematic DRC violations are likely to occur and the systematic DRC violations may be reduced or eliminated, for example, by adjusting the placement layout by the density control tool 34. Additionally, the DRC violation prediction circuitry 132 and/or the DRC machine learning circuitry 110 may determine that the placement layout is invalid or unroutable since systematic DRC violations are predicted to be present as a result of routing the placement layout.

In some embodiments, the routing congestion removal platform 30 may provide feedback to the electronic design platform 20 (e.g., to the placement tool 24) based on the predicted or determined DRC violations in the placement layout. At 426, the electronic design platform 20 may optimize or otherwise improve a placement recipe based on the DRC inferences made at 424. For example, the recipe utilized by the placement tool 24 to generate or produce subsequent placement layouts may be adjusted or otherwise optimized in view of the predicted or determined systematic DRC violations of a placement layout, and the improved recipe may be utilized to generate subsequent placement layouts which are less likely to have DRC violations.

Figure 6A:
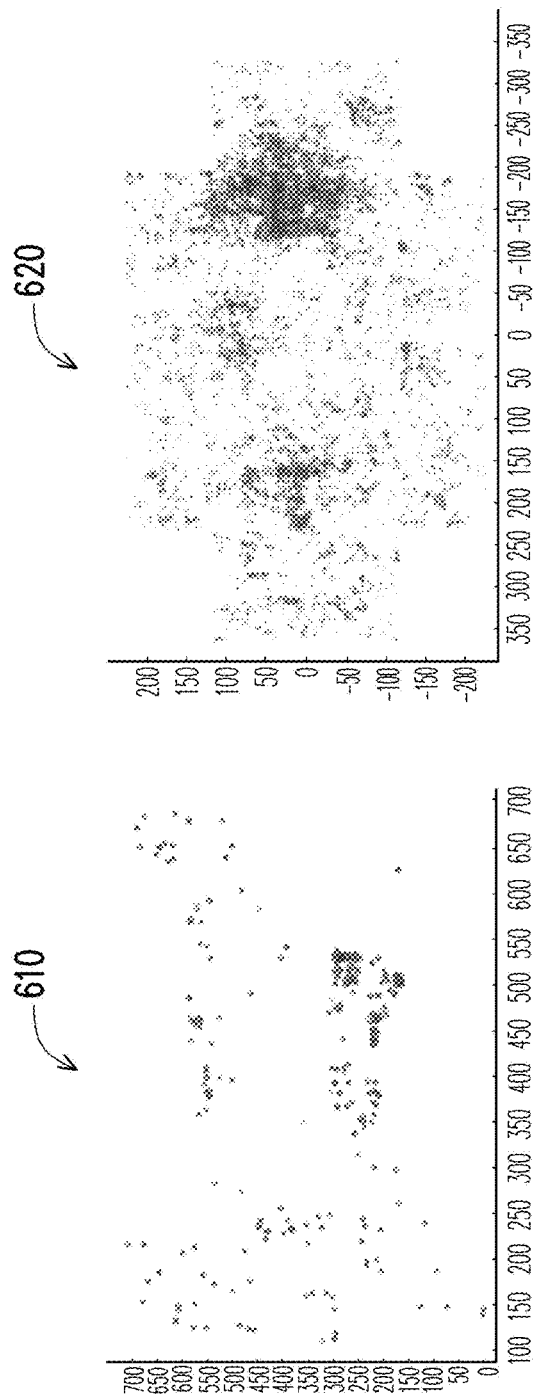
FIG. 6A is a diagram illustrating raw DRC distributions in example first and second electronic device designs, in accordance with some embodiments.

FIG. 6A is a diagram illustrating raw DRC distributions in a first electronic device design 610 and in a second electronic device design 620. In both the first and second electronic device designs 610, 620, the dots indicate positions of particular DRC violations within the electronic device designs (e.g., positions indicated by x-axis and y-axis coordinates). The electronic device designs 610, 620 may be electronic device designs which include routing information, for example, after routing of a placement layout by the routing tool 26. The electronic device designs 610, 620 may be used to train the machine learning model, such as a machine learning model implemented by the DRC violation prediction circuitry 132 and/or the DRC machine learning circuitry 110 and which may be at least partially stored, for example, in the systematic DRC database 112 and/or the processed pattern database 114. As shown in FIG. 6A, the first electronic device design 610 has fewer DRC violations, while the second electronic device design 620 has more DRC violations. This can be seen from the fact that there are more dots indicating positions of DRC violations in the second electronic device design 620 than in the first electronic device design 610. Additionally, it can be seen that the second electronic device design 620 has regions (e.g., toward the right side of the second electronic device design 620) with a high density of DRC violations.

The raw DRC distributions shown in the first and second electronic device designs 610, 620 may be generated, for example, by the verification tool 28. The raw DRC distributions may be provided, for example, in DRC-violation maps which indicate locations (e.g., x- and y-axis location) of the DRC violations in the electronic device designs 610, 620, as shown in FIG. 6A.

The raw DRC distributions may be transformed into probability functions, which may prevent or reduce the effects of random noise on the training of the machine learning model with DRC data. For example, the raw DRC distributions from a plurality of electronic device designs may be combined with one another, and probability functions may be generated which indicate relative probabilities of DRC violations occurring at various locations (e.g., coordinate locations) of a design. For example, higher probabilities of DRC violations are assigned to coordinates at which multiple electronic device designs have DRC violations (e.g., as indicated by the raw DRC distributions), and lower probabilities of DRC violations are assigned to coordinates at which no or very few DRC violations occur. As such, a probability function or probability map may be generated for an electronic device design, taking into account the real or raw DRC distributions of a plurality of electronic device designs (or of a plurality of different instances of a same electronic device design).

Figure 6B:
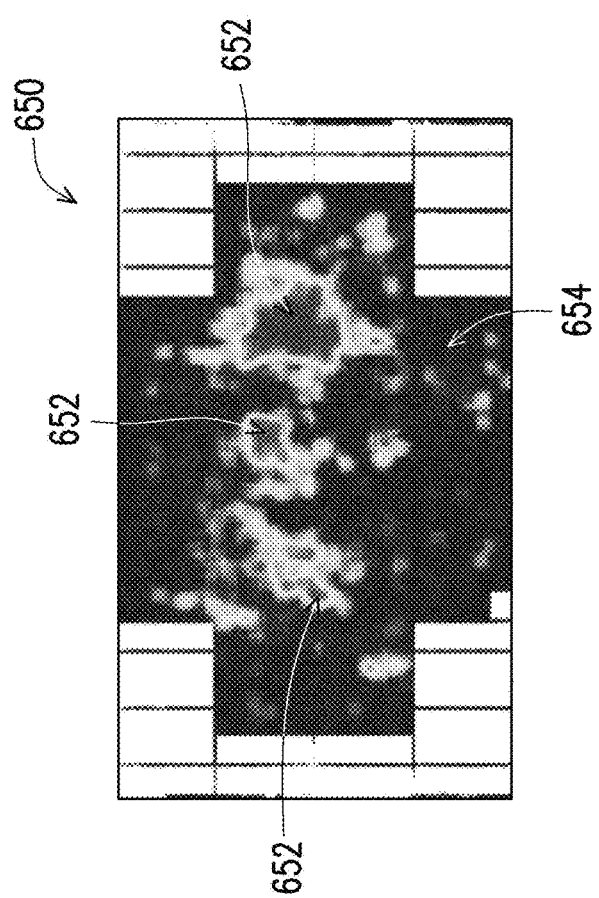
FIG. 6B illustrates a probability mass function transform map resulting from performing a probability mass function transformation with respect to a raw DRC distribution of an electronic device design, in accordance with some embodiments.

FIG. 6B illustrates a probability mass function transform map 650 resulting from performing a probability mass function transformation with respect to a raw DRC distribution of an electronic device design. The probability mass function transform map 650 may be generated from the raw DRC distribution of any one or more electronic device designs. For example, the probability mass function transform map 650 may be generated from the raw DRC distribution in the first electronic device design 610, the raw DRC distribution in the second electronic device design 620, or a combination of the raw DRC distributions in the first and the second electronic device designs 610, 620. A probability mass function is a function that gives the probability that a discrete random variable is exactly equal to some value. In the probability mass function transform map 650, each coordinate on the probability mass function transform map 650 indicates a probability of a DRC violation occurring at that particular coordinate. The probabilities of DRC violations occurring at the coordinates may be developed, for example, by combining raw DRC distributions across a plurality of electronic device designs. For example, higher probabilities of DRC violations are assigned to coordinates at which multiple electronic device designs have DRC violations.

By performing the probability mass function transform on raw DRC distribution data, the effect of random noise may be reduced or eliminated when training the learning model. For example, since probabilities may be determined based on raw DRC distributions of a plurality of electronic device designs, the probabilities indicate higher chances of DRC violations occurring at particular coordinates, thereby reducing noise from the lower probability locations (e.g., where few or no DRC violations occur). The probability mass function transform map 650 represents probabilities of DRC violations in various locations of an electronic device layout. By performing the probability mass function transform on real or raw DRC violation data, the raw DRC data is transformed into systematic DRC data, or systematic DRC violation data which indicates locations, features, or groupings of features which exhibit a high probability or likelihood of DRC violations being present in an electronic device design. As shown in FIG. 6B, first regions 652 of the probability mass function transform map 650 may indicate a relatively high likelihood of DRC violations being present, while second regions 654 may indicate a relatively low likelihood of DRC violations being present. One or more thresholds may be set, and probabilities indicated in the probability mass function transform map 650 may be compared to the one or more thresholds to provide the first regions 652 and/or the second regions 654.

In some embodiments, the DRC machine learning circuitry 110 may implement a mixed global and local machine learning approach, which may be referred to as a mixed design-pattern regression. The mixed design-pattern regression may utilize a global model or "design", which is trained based on entire placement layouts after routing has been performed and which may be utilized to predict or determine the presence and locations of DRC violations for an entire particular placement layout, and a local model or "pattern", which is trained based on sub-regions of placement layouts after routing has been performed and which may be utilized to predict or determine the presence and locations of DRC clusters or regions of a placement layout in which a plurality of proximate DRC violations are predicted or determined to occur.

Figure 7A:
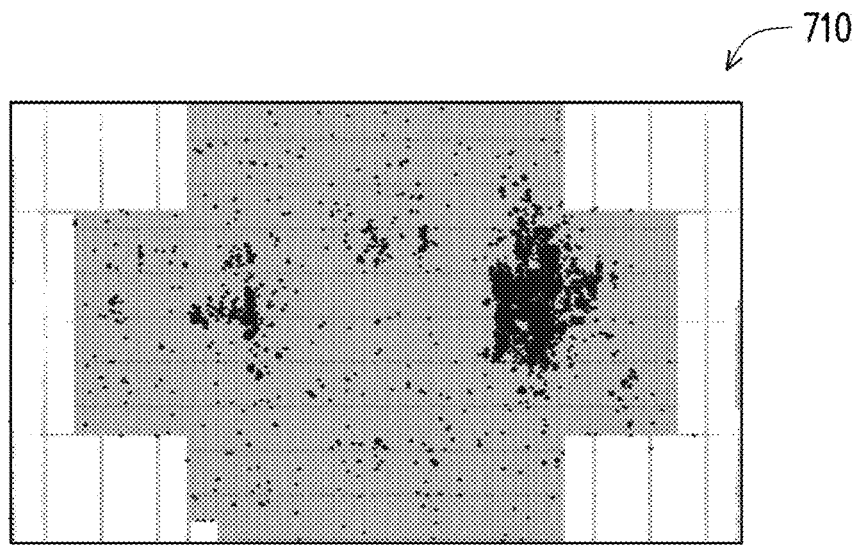
FIG. 7A is a diagram illustrating a real DRC distribution map of a training design, in accordance with some embodiments.

FIG. 7A is a diagram illustrating a real DRC distribution map of a training design 710, which may be referred to as a global model. The training design 710 represents an electronic device design's overall behavior, e.g., with respect to a real distribution of DRC violations. The training design 710 may be generated based on entire placement layouts after routing has been performed, including information indicative of presence and location of systematic DRC violations. For example, based on the training, the training design 710 may represent the actual locations of DRC violations for a particular placement layout, which may include or otherwise be based on locations of DRC violations for a plurality of different electronic devices having the same placement layout (which may be provided as training data for training and generating the training design 710). The x-axis and y-axis may indicate units of distance of the training design 710, and the locations of DRC violations are indicated by the dots shown in the diagram of FIG. 7A. The dots indicate geographical positions of particular DRC violations within the training design 710.

Figure 7B:
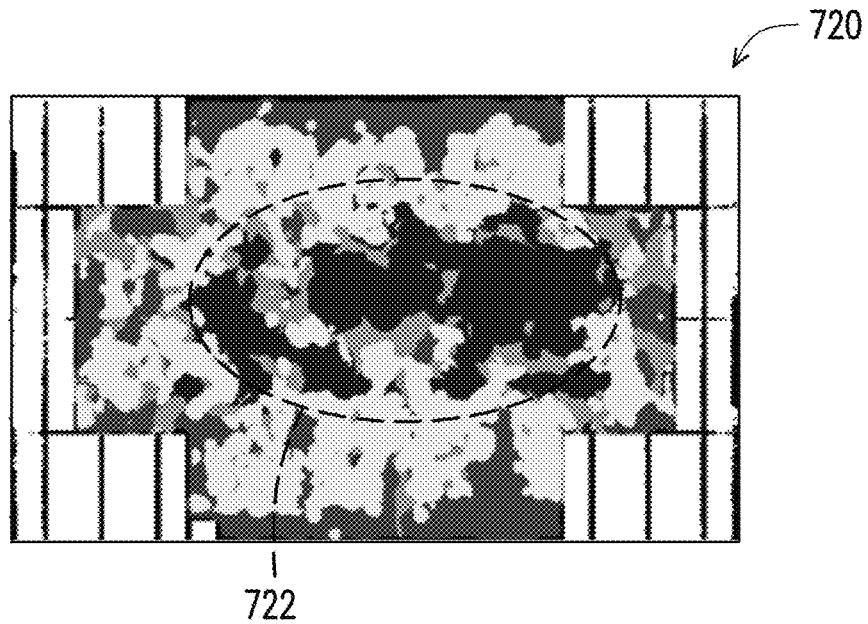
FIG. 7B is a diagram illustrating a pattern which may be generated from a training design, in accordance with some embodiments.

FIG. 7B is a diagram illustrating a pattern 720 which may be generated from the training design 710, for example, by the DRC machine learning circuitry 110. The pattern 720 may indicate a relationship between one or more features (e.g., extracted features, such as a number of network nodes or nets, a number of cells 512, a number of multi-height cells, cell density, fan-in or fan-out information, or the like) of the training design 710, such as positional relationships or proximal groupings of the features. In some embodiments a plurality of different patterns 720 may be generated based on the training design 710, with each such pattern 720 indicating relationships between different features of the training design 710. In some embodiments, the patterns 720 may further indicate a relationship between features of the training design 710 and DRC violations or probabilities of DRC violations in the training design 710. For example, the pattern 720 may be generated, in some embodiments, based on or otherwise associated with a probability mass function transform map of the training design 710. In some embodiments, a pattern 720 may be generated for each of a plurality of regions (e.g., for each grid cell or for each of a plurality of groupings of grid cells) of the training design 710. The pattern 720 may be one of a plurality of patterns 720 which may indicate routing congestion in an electronic device design and/or in one or more regions of an electronic device design.

The patterns 720 may be stored as routing congestion patterns, for example, in the processed pattern database 114. The patterns 720 may represent local models, which model local behaviors (e.g., behaviors of a particular region, for example, based on one or more features of the region). In some embodiments, the patterns 720 may include one or more systematic DRC clusters 722, which may indicate regions of the pattern 720 where a plurality of systematic DRC violations are predicted or determined to occur. In some embodiments, the DRC machine learning circuitry 110 may analyze the training design 710 may identify or generate the systematic DRC clusters 722 using cosine similarity to determine a similarity between various features of the training design 710. For example, the systematic DRC clusters 722 may be generated based on similar feature distances, which may be determined using cosine similarity or a cosine similarity matrix.

By building the training design 710 (e.g., by determining the real DRC violation distribution of the electronic device design) and building associated pattern models (e.g., the patterns 720) having systematic DRC clusters 722, risky structures in an electronic device design which are prone to systematic DRC violations may be captured and identifiable by the machine learning model. In some embodiments, the prediction or determination (e.g., by the DRC violation prediction circuitry 132) of whether one or more systematic violations would be present in a placement layout may be performed by comparing the placement layout or by comparing regions of the placement layout with the routing congestion patterns 720.

In some embodiments, a classifier guided regression may be implemented, for example, by the DRC machine learning circuitry 110 as part of training of the machine learning model. The classifier guided regression may be used to estimate the relationships among variables, such as a relationship between the presence of DRC violations in a placement layout and one or more features associated with the placement layout which may be statistically related to the presence of DRC violations (e.g., a number of network nodes or nets, a number of cells, a number of multi-height cells, cell density, fan-in or fan-out information, or the like within a particular region or area of the placement layout). Each of the one or more features associated with the placement layout which may be statistically related to the presence of DRC violations may be considered a "classifier" which may be utilized to predict whether a particular placement layout is "routable" or "unroutable" (e.g., whether the placement layout is relatively free of systematic DRC violations and is therefore routable, or if it has many systematic DRC violations and thus is unroutable). Multiple classifiers may be trained, with each classifier being trained to predict or otherwise indicate whether a particular placement layout is "routable" or "unroutable." A routable placement layout is one which is predicted to be free of systematic DRC violations, or which has a number of predicted systematic DRC violations that is less than some threshold value. An unroutable placement layout is one which is predicted to have one or more systematic DRC violations, or which has a number of predicted systematic DRC violations that is greater than the threshold value.

Figure 8A:
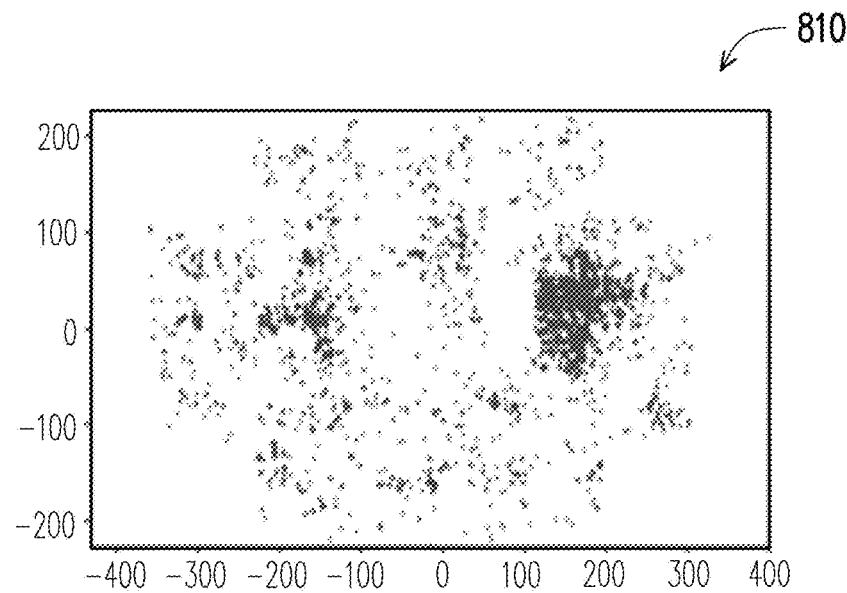
FIG. 8A is a diagram illustrating a real DRC distribution map of a routable electronic device design which may be used as training data, in accordance with some embodiments.

FIG. 8A is a diagram illustrating a real DRC distribution map of an electronic device design 810, which is determined to have a plurality of DRC violations. The x-axis and y-axis indicate units of distance along the electronic device design 810, and the DRC violations are indicated by the dots shown in the diagram of FIG. 8A. That is, the dots indicate geographical positions of particular DRC violations within the electronic device design 810 (e.g., positions indicated by x-axis and y-axis coordinates). The electronic device design 810 may be provided as training data, for example, to the DRC machine learning circuitry 110. To determine whether the electronic device design 810 represents a routable layout or an unroutable layout (e.g., whether the class is routable or unroutable), each region of the electronic device design 810 may be inspected, and if all of the regions have zero or fewer than some threshold number of DRC violations, then the electronic device design 810 would represent a routable layout. However, as shown in FIG. 8A, there are many DRC violations in the electronic device design 810, as indicated by the numerous dots of the diagram of FIG. 8A, and thus the class for the electronic device design 810 is "unroutable."

Figure 8B:
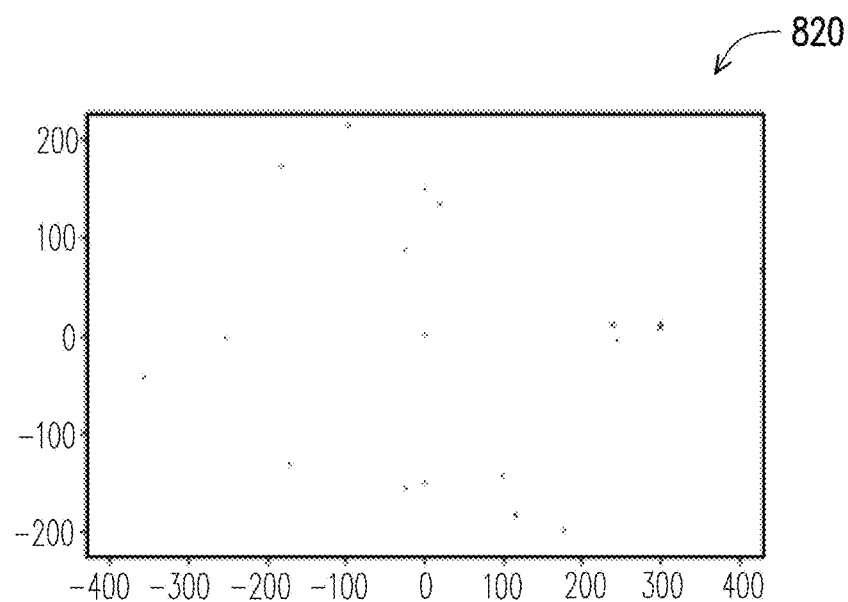
FIG. 8B is a diagram illustrating a real DRC distribution map of an unroutable electronic device design which may be used as training data, in accordance with some embodiments.

FIG. 8B is a diagram illustrating a real DRC distribution map of an electronic device design 820, which is determined to represent a routable layout, as there are very few DRC violations in the electronic device design 820, as indicated by the relatively few number of dots shown in the diagram of FIG. 8B. Therefore, the class for the electronic device design 820 is "routable."

As noted above, classifiers are used to indicate that a particular placement layout is routable or unroutable. The classifiers may be, for example, features that are associated with the placement layout which may be statistically related to the presence of DRC violations (e.g., a number of network nodes or nets, a number of cells, a number of multi-height cells, cell density, fan-in or fan-out information, or the like within a particular region or area of the placement layout). Each of the classifiers may be trained, with each classifier being trained to predict or otherwise indicate whether a particular placement layout is "routable" or "unroutable." In some embodiments, each classifier may represent a particular algorithm, or a particular mathematical function implemented by a classification algorithm, that maps input data (e.g., an input feature of an electronic device design or placement layout) to a particular category or class (e.g., "routable" or "unroutable"). In some embodiments, any or all of the extracted features of an electronic device design or placement layout may be utilized as a classifier, and each such classifier may be trained to predict the presence of one or more DRC violations in a placement layout and/or whether the placement layout is routable or unroutable.

Figure 9A:
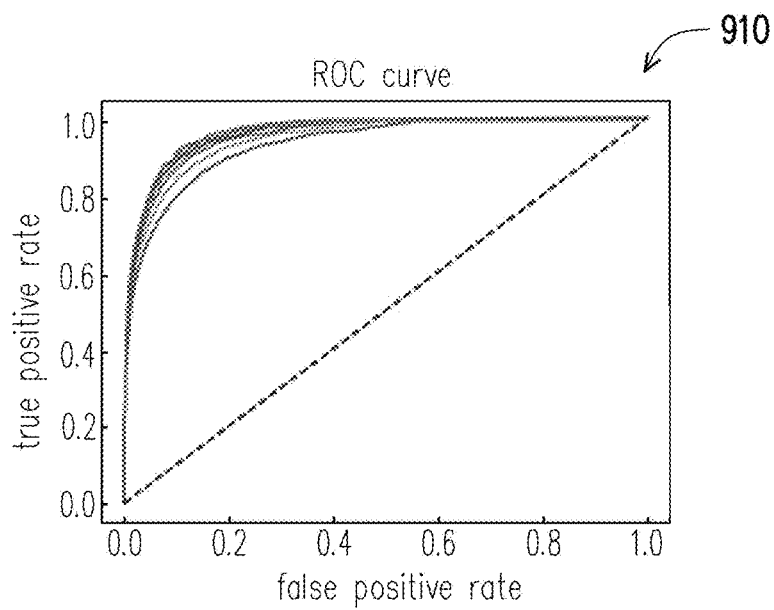
FIGS. 9A through 9C are plots illustrating examples of receiver operating characteristic (ROC) curves which may be generated by DRC machine learning circuitry, in accordance with some embodiments.
Figure 9B:
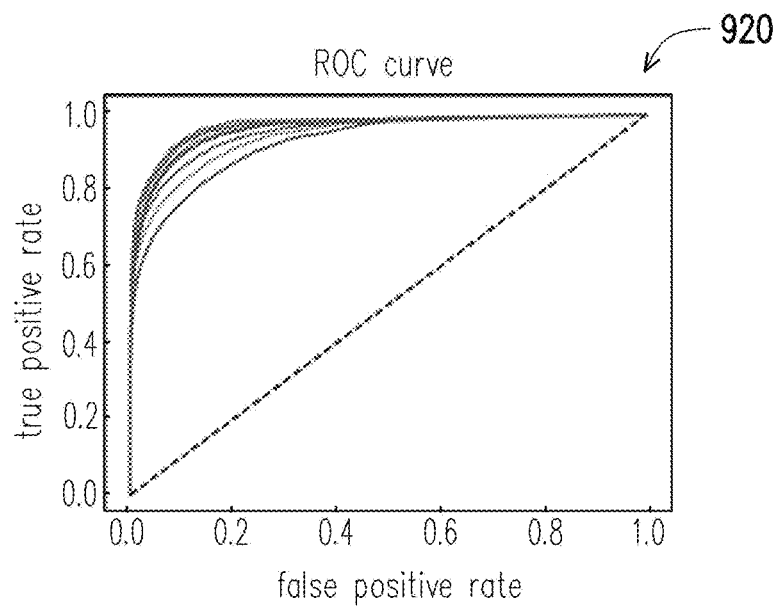
Figure 9C:
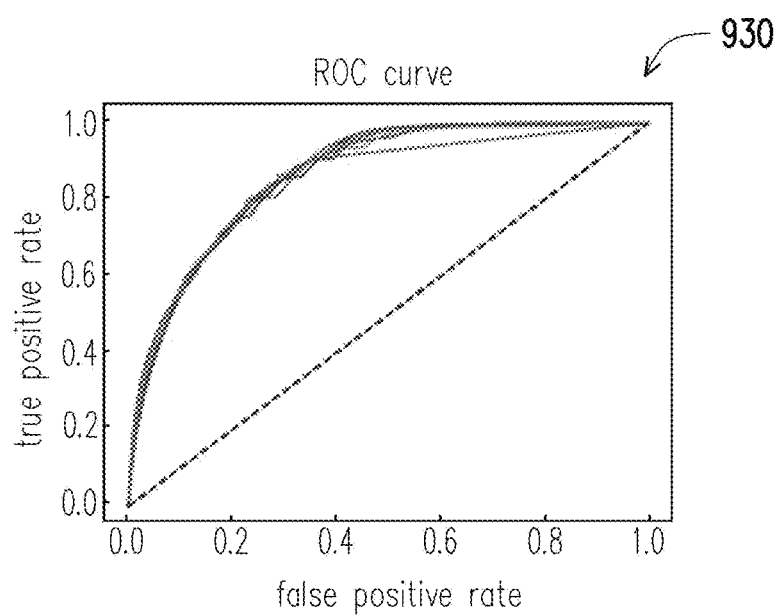

FIGS. 9A through 9C are plots illustrating examples of receiver operating characteristic (ROC) curves 910, 920, 930 which may be generated, for example, by the DRC machine learning circuitry 110 and which indicate the abilities of each of the multiple trained classifiers (e.g., the extracted features) to predict whether a placement layout is a routable or unroutable layout.

The ROC curves 910, 920, 930 may be created by plotting the true positive rate (TPR) (y-axis) against the false positive rate (FPR) (x-axis) for a particular classifier at various threshold settings, with each of the various threshold settings being represented by a particular curved line in the ROC curves 910, 920, 930. The true positive rate (TPR) refers to the rate at which a particular classifier correctly identifies actual positives, for example, the rate at which a particular classifier correctly identifies a routable placement layout. The false positive rate (FPR) refers to the rate at which a particular classifier incorrectly identifies an actual negative as a positive, for example, the rate at which a particular classifier incorrectly identifies a routable placement layout as unroutable.

A separate ROC curve may be generated for each of the trained classifiers, and one or more routability pivots, e.g., particular classifiers and/or threshold settings (or a particular curved line in the ROC curve) which are most predictive of routability or unroutability may be selected. In some embodiments, the best routability pivots may be automatically selected, for example, by the DRC machine learning circuitry 110. The best routability pivots may be the curved lines representing particular classifiers and threshold settings which produce the highest ratios of true positive rate to false negative rate. This can be identified from the ROC curves 910, 920, 930, for example, as the ROC curves which extend the further toward the upper left corner have the highest ratios of true positive rate to false negative rate. Accordingly, the classifiers and/or the particular threshold settings for each classifier which produce the best predictive results regarding DRC violations (e.g., predicting whether a placement layout is routable or unroutable) may be selected, for example, by the DRC machine learning circuitry 110.

Once the classifiers and/or particular threshold settings for each classifier which produce the best predictive results have been selected, such classifiers and/or particular threshold settings may be utilized, for example, by the DRC machine learning circuitry 110 and/or the DRC violation prediction circuitry 132 to predict or determine whether a particular placement layout has one or more systematic DRC violations, and whether the placement layout is routable or unroutable.

Figure 10A:
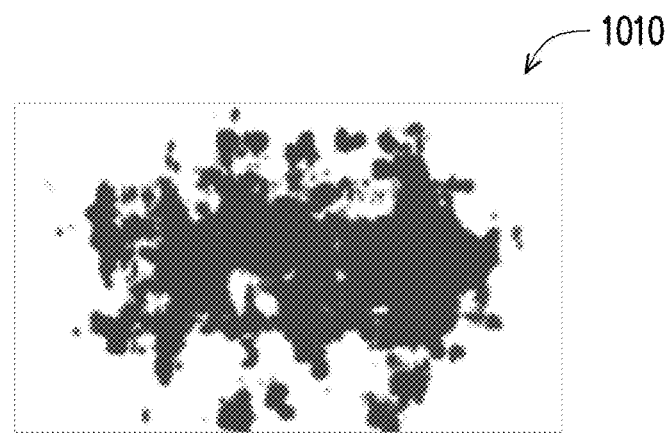
FIGS. 10A and 10B are diagrams illustrating examples of systematic DRC violation predictions with different sensitivities, in accordance with some embodiments.

In some embodiments, a systematic DRC regressor may be used to train a best threshold for predicting systematic DRC violations based on the probability mass function transform, and the threshold may be used as a threshold which predicts or determines the presence of systematic DRC violations (and filters out random DRC violations) in a placement layout. The systematic DRC regressor may be any regression which may be used to estimate the relationships among variables, such as relationships between the threshold and the sensitivity for predicting the presence of systematic DRC violations in a received placement layout. The sensitivity for predicting the presence of systematic DRC violations may thus be adjusted, and in some embodiments may be automatically adjusted for example by the DRC machine learning circuitry 110, based on training of the threshold by the systematic DRC regressor. By adjusting the sensitivity, the catching rate (e.g., the rate at which systematic DRC violations are accurately predicted) may be increased as illustrated in FIG. 10A and/or a false alarm rate (e.g., the rate at which systematic DRC violations are predicted to occur, but are not actually present) may be reduced as illustrated in FIG. 10B.

The threshold (e.g., the threshold for determining the catching rate and/or false alarm rate) may be trained based on the probability mass function transform, for example, the probability mass function transform map 650 shown in FIG. 6B, which may result from performing a probability mass function transformation with respect to a raw DRC distribution of an electronic device design. The sensitivity may be adjusted, for example, by setting a particular probability (e.g., as determined from the probability mass function transform map 650) as a threshold equal to or above which indicates the presence of a systematic DRC violation. As shown in FIG. 10A, with a relatively low threshold being set, a relatively higher catching rate results and a DRC violation map 1010 is generated in which many regions of a placement layout are indicated as having systematic DRC violations. In some embodiments, the threshold may be automatically determined based on feature values during training of the model.

Figure 10B:
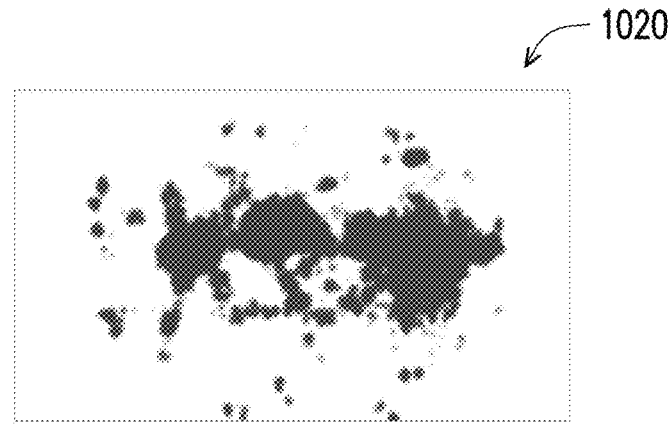

In contrast, as shown in FIG. 10B, with a relatively high threshold being set (e.g., a threshold corresponding to a relatively high probability of systematic DRC violations being present), the catching rate may be reduced; however, a false alarm rate is decreased, and a DRC violation map 1020 is generated in which fewer regions of the placement layout are indicated as having systematic DRC violations.

In some embodiments, a response weighted ensemble may be utilized, for example, by the DRC violation prediction circuitry 132 and/or the DRC machine learning circuitry 110 to predict or determine the presence of one or more systematic DRC violations in a particular placement layout. For example, in some embodiments, a weighted ensemble may be generated by combining (e.g., by multiplication) a most similar local model or sub-model and a global model.

Figure 11A:
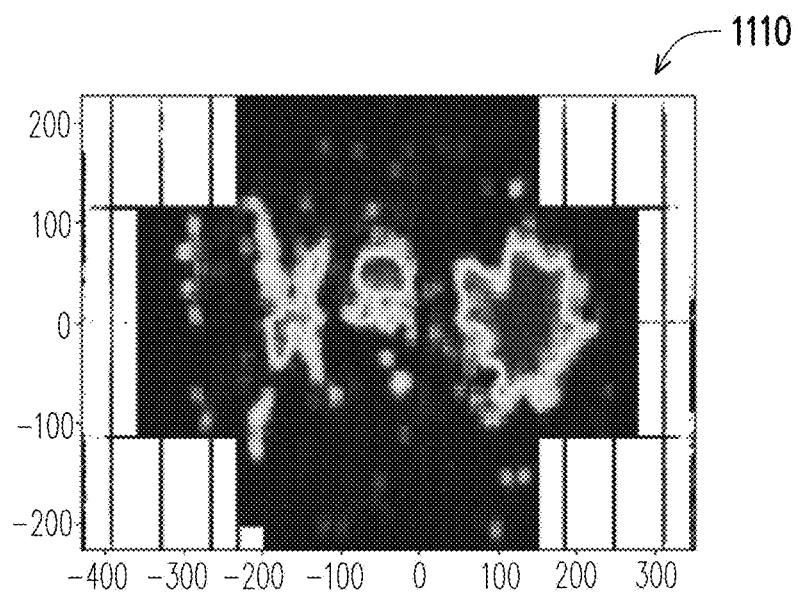
FIG. 11A is a diagram illustrating an example probability mass function transform map which may be generated from raw DRC distribution of a particular electronic device design, in accordance with some embodiments.

FIG. 11A is a diagram illustrating an example probability mass function transform map 1110 which may be generated from raw DRC distribution of a particular electronic device design, for example, after routing has been performed on the particular electronic device design. The probability mass function transform map 1110 may thus be generated in a same way as described above with respect to the probability mass function transform map 650 (e.g., it may be generated based on raw DRC distribution from one or more electronic device designs, such as the raw DRC distributions shown in FIGS. 6A and 6B).

Figure 11B:
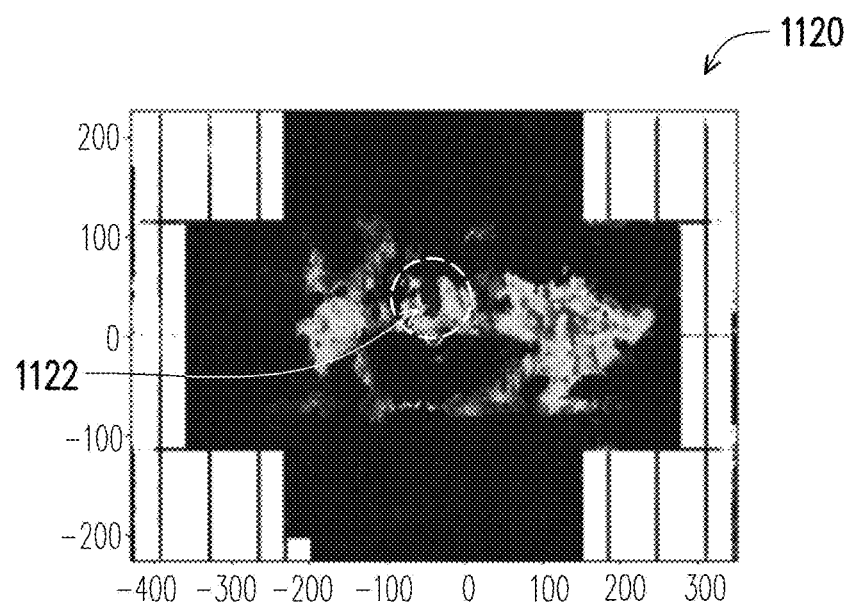
FIG. 11B is a diagram illustrating a local model, which may be a local model that is most similar to the probability mass function transform map of FIG. 11A, in accordance with some embodiments.
Figure 11C:
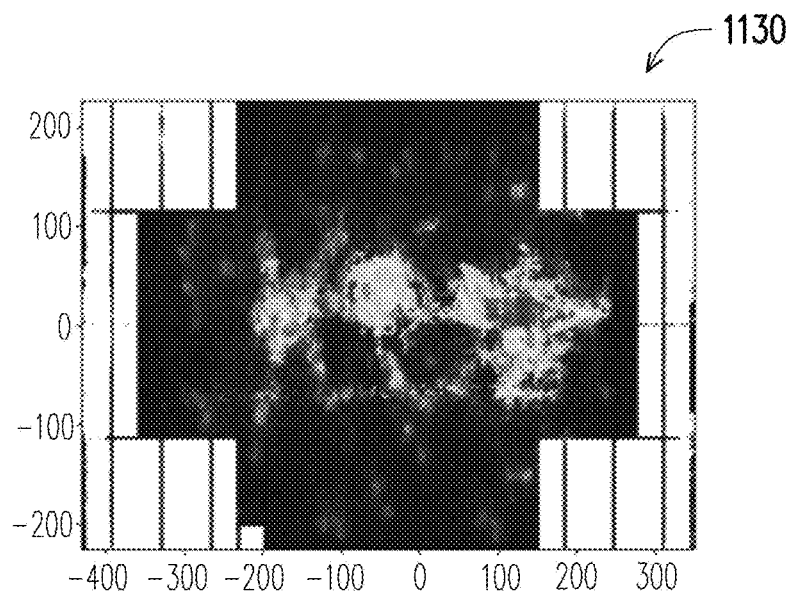
FIG. 11C is a diagram illustrating a weighted ensemble generated by combining a global model with the local model shown in FIG. 11B, in accordance with some embodiments.
Figure 11D:
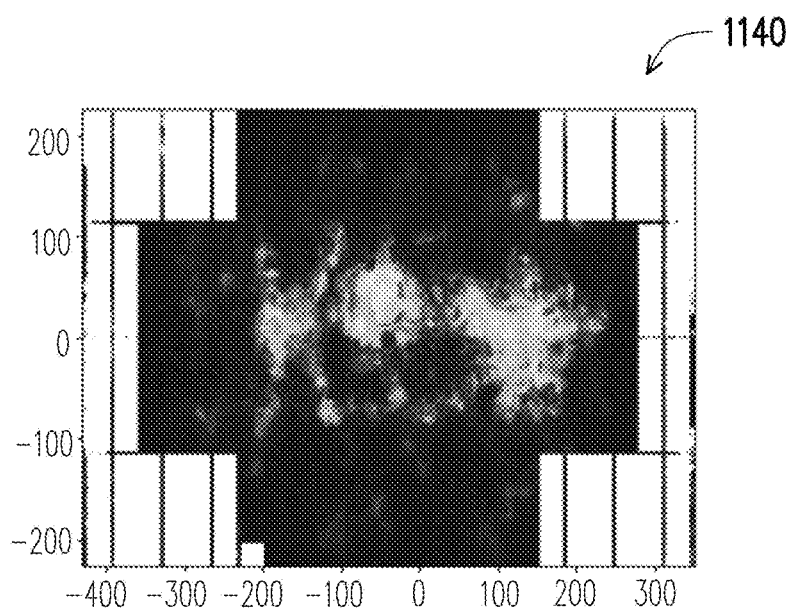
FIG. 11D is a diagram illustrating a weighted ensemble generated by combining a global model with a top three most similar local models, in accordance with some embodiments.

FIGS. 11B through 11D are diagrams which illustrate prediction of systematic DRC violations in the placement layout of the particular electronic device design, for example, prior to routing the electronic device design.

FIG. 11B illustrates a local model 1120, which may represent a local model which is most similar to a particular placement layout and/or to the probability mass function transform map of the particular placement layout. As can be seen, the local model 1120 does not perfectly match the actual probability mass function transform map 1110 shown in FIG. 11A. For example, broken regions 1122 exist in the local model 1120 in which systematic DRC violations are not indicated to occur with a high probability, yet corresponding systematic DRC violations are indicated to occur with a high probability in the probability mass function transform map 1110 of FIG. 11A.

However, the local model 1120 may be selected, for example, by the DRC machine learning circuitry 110, and may be combined with the global model (not shown) to produce a weighted ensemble 1130, as shown in FIG. 11C. As can be seen from FIG. 11C, the weighted ensemble 1130 better predicts or matches the systematic DRC violations which are known, for example, from the probability mass function transform map 1110 of the raw DRC distribution of the actual electronic device design.

In some embodiments, a weighted ensemble may be generated by combining a plurality of most similar local models and the global model. For example, FIG. 11D is a diagram illustrating a weighted ensemble 1140 in which the top three most similar local models are selected and combined with the global model. This may increase the accuracy of systematic DRC violation predictions, for example, by the DRC violation prediction circuitry 132 and/or the DRC machine learning circuitry 110.

Figure 12A:
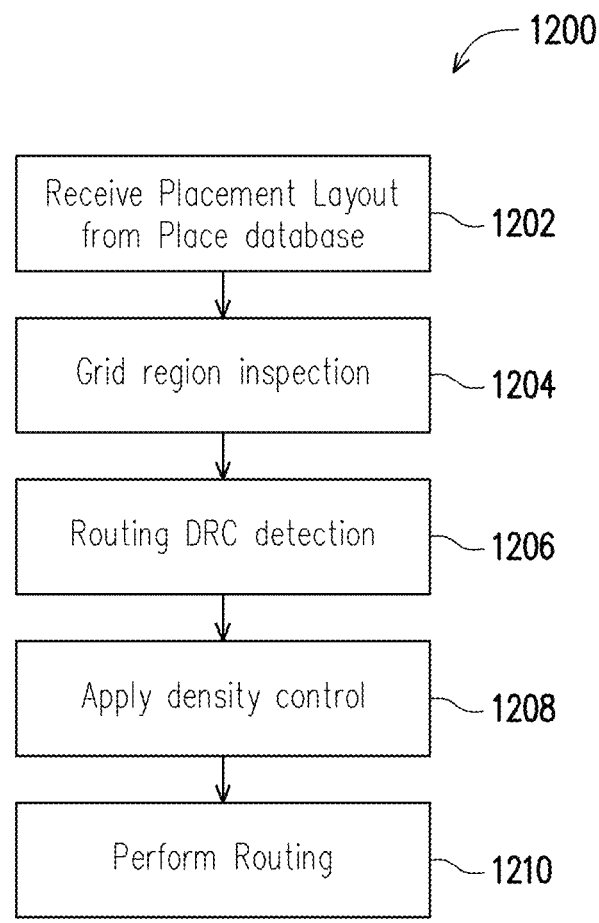
FIG. 12A is a flowchart illustrating a systematic DRC violation prediction method, in accordance with some embodiments.

FIG. 12A is a flowchart 1200 illustrating a systematic DRC violation prediction method, in accordance with one or more embodiments. The systematic DRC violation prediction method may be implemented at least in part, for example, by the routing congestion removal platform 30 shown in and described with respect to FIG. 1 and/or by the DRC violation prediction system 100 shown in and described with respect to FIG. 2.

At 1202, placement data associated with a placement layout is received from a place database, such as the placement database 102 of the DRC violation prediction system 100. The placement data may be received, for example, by the DRC violation prediction circuitry 132, and the placement data may be associated with a particular placement layout generated, for example, by the placement tool 24 of the electronic design platform 20.

At 1204, grid regions of the placement layout are inspected, for example, by the DRC violation prediction circuitry 132. Each grid region of the placement layout may be inspected separately, region-by-region, at 1204.

At 1206, routing DRC detection is performed. The routing DRC detection performed at 1206 may include predicting or determining, for example, by the DRC violation prediction circuitry 132 and/or the DRC machine learning circuitry 110 whether one or more systematic DRC violations would be present in any of the grid regions of the placement layout should the placement layout proceed to be routed, for example, by the routing tool 26.

At 1208, density control is applied to the placement layout in response to one or more systematic DRC violations being predicted to be present at 1206. Density control may be applied, for example, by the density control tool 34 to remove or avoid the predicted DRC violations that would exist in the placement layout.

At 1210, routing of the placement layout is performed, for example, by the routing tool 26. The routing is performed after density control is applied at 1208, so that systematic DRC violations will be reduced or eliminated in the placement layout after routing is performed.

Figure 12B:
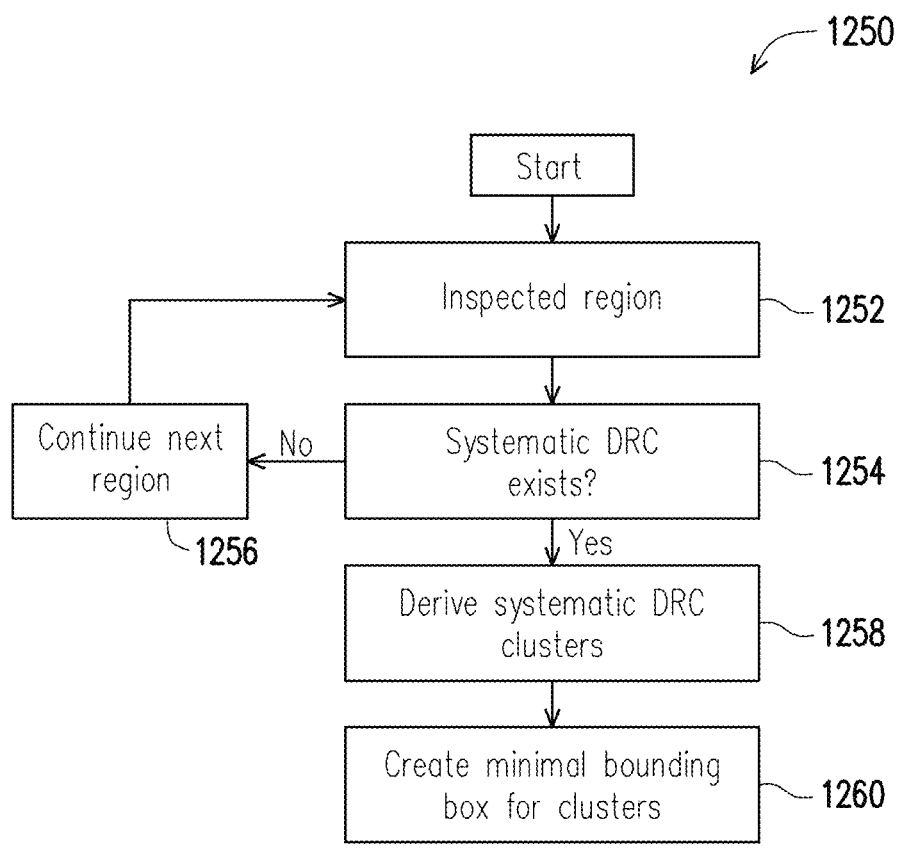
FIG. 12B is a flowchart illustrating further details of the grid region inspection and the routing DRC detection of the flowchart of FIG. 12A, in accordance with some embodiments.

FIG. 12B is a flowchart 1250 illustrating further details of the grid region inspection (1204) and the routing DRC detection (1206) of the flowchart 1200 of FIG. 12A.

At 1252, a particular region of the placement layout is inspected, for example, by the DRC violation prediction circuitry 132 and/or the DRC machine learning circuitry 110.

At 1254, the DRC violation prediction circuitry 132 and/or the DRC machine learning circuitry 110 predicts or determines whether one or more systematic DRC violations would exist in the inspected region due to routing, before routing is performed on the placement layout.

At 1256, if no systematic DRC violations are predicted to be present in the inspected region, then the flowchart continues to a next region of the placement layout, and the flowchart returns to 1254 in which the next region of the placement layout is inspected, for example, by the DRC violation prediction circuitry 132 and/or the DRC machine learning circuitry 110. If none of the regions of the placement layout are predicted to have systematic DRC violations (e.g., which are predicted to result due to a subsequent routing process), then the placement layout may pass the inspection, in which case, the placement layout may be considered a valid or routable placement layout that may proceed to physical design and/or may proceed to physical routing of the particular circuit layout.

On the other hand, if one or more systematic DRC violations are predicted to be present in the inspected region, then systematic DRC clusters are derived at 1258. The systematic DRC clusters may be derived for each inspected region which is predicted or determined to have one or more systematic DRC violations. Systematic DRC clusters may be derived, for example, by the DRC violation prediction circuitry 132 and/or the DRC machine learning circuitry 110 utilizing any suitable technique, including, for example, utilizing cosine similarity to identify or generate clustered DRC patterns in the placement layout.

At 1260, a minimal bounding box may be created for the derived systematic DRC clusters. The DRC violation prediction circuitry 132 and/or the DRC machine learning circuitry 110 may create the minimal bounding box. The minimal bounding box may be a box or boundary which surrounds or otherwise identifies the derived systematic DRC clusters, while minimizing or otherwise limiting the area of the bounding box to the identified systematic DRC cluster region. Accordingly, an actual location, e.g., a geographical location on a particular placement layout, where a cluster of systematic DRC violations are likely to occur with a high probability may be identified, for example, by the DRC violation prediction circuitry 132 and/or the DRC machine learning circuitry 110.

One or more operations may be performed in response to identifying one or more predicted systematic DRC clusters in a particular placement layout, including, for example, determining that the placement layout is invalid or otherwise unsuitable for use since systematic DRC violations are predicted to be present as a result of routing the placement layout. In some embodiments, the placement layout may be adjusted to remove or otherwise address the predicted occurrence of one or more systematic DRC violations, for example, by applying density control at 1208 of the flowchart 1200 shown in FIG. 12A.

Embodiments of the present disclosure provide several advantages. For example, in some embodiments, chip area of a physical semiconductor device may be significantly reduced due to reductions in routing violations (e.g., systematic DRC violations) which may be predicted by embodiments of the disclosure. Moreover, embodiments of the disclosure are operable to determine whether systematic DRCs are present before routing, which facilitates prediction of the presence of, as well as identification of predicted locations of, routing violations at an early stage. This provides a significant advantage over conventional systems in which DRC violations due to routing are determined only after routing has been performed.

Embodiments of the present disclosure further facilitate significant improvements in design implementation turn-around time, since systematic DRC violations may be predicted, and reduced or eliminated, prior to routing of the placement layout. This also results in significant reductions in a number of DRC violations, since such DRC violations may be predicted and reduced or eliminated prior to routing the placement layout. Moreover, the number of DRC violations may be reduced in subsequent placement layouts, as a recipe for placement layout may be informed by, and in some embodiments may be optimized based on, the prediction or detection of systematic DRC violations. Additionally, circuit speed in resulting electronic device designs may be improved significantly by embodiments of the present disclosure, as better routing (e.g., routing in which systematic DRC violations are avoided or reduced) is provided.

The present disclosure provides, in various embodiments, systems and methods that may be utilized to predict systematic design rule check (DRC) violations that would be present due to routing the placement layout, before routing is performed on the placement layout. This results in cost savings, since the chip area of an electronic device may be reduced due to reductions in DRC violations which can be predicted and then reduced or eliminated. Additionally, time savings are facilitated by embodiments of the present disclosure, since systematic DRC violations in electronic device designs may be predicted prior to performing routing of the placement layout.

According to one embodiment, a systematic design rule check (DRC) violation prediction system includes DRC violation prediction circuitry. The DRC violation prediction circuitry, when in use, receives placement data associated with a placement layout. The DRC violation prediction circuitry may receive the placement data, for example, from a placement layout database or from a placement tool of an electronic design platform. The DRC violation prediction circuitry inspects the placement data associated with the placement layout. The placement data may include data associated with a plurality of regions of the placement layout, and the DRC violation prediction circuitry may inspect each region of the placement layout on a region-by-region basis. Additionally, the DRC violation prediction circuitry, when in use, predicts whether one or more systematic DRC violations would be present in the placement layout due to a subsequent routing of the placement layout.

According to another embodiment, a method is provided that includes receiving, by design rule check (DRC) violation prediction circuitry, a placement layout of a semiconductor circuit design. Placement data associated with each of a plurality of regions of the placement layout is inspected by the DRC violation prediction circuitry. For each of the plurality of regions, the DRC violation prediction circuitry predicts whether one or more systematic DRC violations would be present due to routing of the placement layout. The method further includes routing the placement layout in response to predicting that no systematic DRC violations would be present due to routing of the placement layout.

According to yet another embodiment, a method is provided that includes training machine learning circuitry with information indicative of design rule check (DRC) violations due to routing congestion in a plurality of electronic device designs. A plurality of routing congestion patterns are developed by the machine learning circuitry based on the training. The plurality of routing congestion patterns includes systematic DRC clusters which indicate regions of the routing congestion patterns having a plurality of systematic DRC violations. The routing congestion patterns are stored in a database. The method further includes receiving, by DRC violation prediction circuitry, placement data associated with a placement layout, and comparing the placement data associated with the placement layout with the plurality of routing congestion patterns stored in the database. The DRC violation prediction circuitry predicts whether one or more systematic DRC violations would be present in the placement layout due to a subsequent routing of the placement layout, based on the comparing the placement data associated with the placement layout with the plurality of routing congestion patterns.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A systematic design rule check (DRC) violation prediction system, comprising:
   DRC machine learning circuitry configured to generate information associated with a plurality of routing congestion patterns, based on past data indicative of presence and location of DRC violations in placement layouts after routing has been performed, the plurality of routing congestion patterns including regions where a plurality of systematic DRC violations are predicted or determined to occur;
   DRC violation prediction circuitry, which, when in use:
      receives placement data associated with a placement layout;
      inspects the placement data associated with the placement layout; and
      predicts, prior to routing the placement layout, whether one or more systematic DRC violations would be caused by routing congestion due to the subsequent routing of the placement layout, based at least in part on the information associated with the plurality of routing congestion patterns; and a placement database which stores the placement data associated with the placement layout.

2. The system of claim 1, further comprising:
a processed pattern database which stores the information associated with the plurality of routing congestion patterns.

3. The system of claim 2, further comprising:
a systematic DRC database which stores information associating systematic DRC violations with at least one of a placement layout or a placement layout region;
wherein the DRC machine learning circuitry is communicatively coupled to the systematic DRC database and to the processed pattern database, the DRC machine learning circuitry, when in use, generates the information associated with the plurality of routing congestion patterns based on the information stored in the systematic DRC database.

4. The system of claim 2 wherein the information stored in the processed pattern database includes probability information indicating probabilities of one or more systematic DRC violations occurring in the plurality of routing congestion patterns.

5. The system of claim 4 wherein the DRC machine learning circuitry, when in use, generates the probability information by performing a probability mass function transformation on the information stored in the systematic DRC database.

6. The system of claim 5 wherein the DRC machine learning circuitry, when in use, identifies systematic DRC clusters in the processed patterns based on the probability information.

7. The system of claim 6 wherein the DRC machine learning circuitry, when in use, identifies the systematic DRC clusters in the processed patterns based on a cosine similarity between one or more features in the processed patterns.

8. The system of claim 6 wherein the systematic DRC violation prediction circuitry, when in use:
   identifies a cluster of predicted systematic DRC violations in the placement layout based on the identified systematic DRC clusters in the processed patterns.

9. The system of claim 8 wherein the systematic DRC violation prediction circuitry, when in use:
   generates a bounding box surrounding the identified cluster of predicted systematic DRC violations in the placement layout; and
   determines a location of the one or more systematic DRC violations in the placement layout based on the bounding box.

10. The system of claim 1, further comprising:
density control circuitry, which, when in use increases a spacing between cells of a region of the placement layout, in response to the DRC violation prediction circuitry predicting that one or more systematic DRC violations would be present in the region of the placement layout due to the subsequent routing of the placement layout.

11. An electronic device design system, comprising:
an electronic design platform including a placement tool configured to generate a placement layout; and
a routing congestion removal platform, including:
   DRC machine learning circuitry configured to generate information associated with a plurality of routing congestion patterns, based on past data indicative of presence and location of DRC violations in placement layouts after routing has been performed, the plurality of routing congestion patterns including, regions where a plurality of systematic DRC violations are predicted or determined to occur, and
   a design rule check (DRC) violation prediction tool configured to:
      receive placement data associated with the placement layout;

inspect the placement data associated with the placement layout; and predict, prior to routing the placement layout, whether one or more systematic DRC violations would be caused by routing congestion due to the subsequent routing of the placement layout, based at least in part on the information associated with the plurality of routing congestion patterns, wherein the DRC violation prediction tool includes a placement database configured to store the placement data associated with the placement layout.

12. The system of claim 11, wherein the DRC violation prediction tool includes:

a processed pattern database configured to store the information associated with the plurality of routing congestion patterns.

13. The system of claim 12, wherein the DRC violation prediction tool includes:

a systematic DRC database which stores information associating systematic DRC violations with at least one of a placement layout or a placement layout region wherein the DRC machine learning circuitry is communicatively coupled to the systematic DRC database and to the processed pattern database, the DRC machine learning circuitry, when in use, generates the information associated with the plurality of routing congestion patterns based on the information stored in the systematic DRC database.

14. The system of claim 11, wherein the routing congestion removal platform includes a density control tool, the density control tool including:

density control circuitry configured to increase a spacing between cells of a region of the placement layout, in response to the DRC violation prediction tool predicting that one or more systematic DRC violations would be present in the region of the placement layout due to the subsequent routing of the placement layout.

15. The system of claim 14, wherein the electronic design platform includes a routing tool configured to perform the routing of the placement layout.

16. An electronic device design system, comprising:
an electronic design platform, including:
a placement tool configured to generate a placement layout; and
a feature extraction tool configured to extract information associated with one or more features of the placement layout; and
a routing congestion removal platform including:
DRC machine learning, circuitry configured to generate information associated with a plurality of routing congestion patterns, based on past data indicative of presence and location of DRC violations in placement layouts after routing has been performed, the plurality of routing congestion patterns including regions where a plurality of systematic DRC violations are predicted or determined to occur;
a design rule check (DRC) violation prediction tool configured to:
receive placement data associated with the placement layout;
inspect the placement data associated with the placement layout, the placement data including the extracted information associated with one or more features of the placement layout; and
predict, prior to routing the placement layout, whether one or more systematic DRC violations would be caused by routing congestion due to the subsequent routing of the placement layout, based at least in part on the information associated with the plurality of routing congestion patterns; and
a density control tool including density control circuitry configured to adjust a spacing between cells of a region of the placement layout, in response to the DRC violation prediction tool predicting that one or more systematic DRC violations would be present in the region of the placement layout due to the subsequent routing of the placement layout, wherein the DRC violation prediction tool includes a placement database configured to store the placement data associated with the placement layout.

17. The system of claim 16, wherein the electronic design platform includes a routing tool configured to perform the routing of the placement layout.

* * * * *